United States Patent
Diaz-Manero et al.

(10) Patent No.: US 7,173,985 B1
(45) Date of Patent: Feb. 6, 2007

(54) METHOD AND APPARATUS FOR IMPLEMENTING A VITERBI DECODER

(75) Inventors: Alejandro Diaz-Manero, West Drayton (GB); Martin Langhammer, Poole (GB); Robert Cottrell, Marlow (GB)

(73) Assignee: Altera Corporation, San Jose, CA (US)

( * ) Notice: Subject to any disclaimer, the term of this patent is extended or adjusted under 35 U.S.C. 154(b) by 751 days.

(21) Appl. No.: 10/212,487

(22) Filed: Aug. 5, 2002

(51) Int. Cl.
*H04L 27/06* (2006.01)
*H03M 13/03* (2006.01)

(52) U.S. Cl. .................................. 375/341; 714/795
(58) Field of Classification Search ............... 375/341, 375/262, 265, 316, 340; 714/795, 796, 786, 714/794, 787
See application file for complete search history.

(56) References Cited

U.S. PATENT DOCUMENTS

| | | | | |
|---|---|---|---|---|
| 4,755,998 A | * | 7/1988 | Gallager | 714/746 |
| 5,418,795 A | * | 5/1995 | Itakura et al. | 714/746 |
| 5,960,011 A | * | 9/1999 | Oh | 714/789 |
| 6,301,314 B1 | * | 10/2001 | Murayama | 375/341 |
| 6,697,443 B1 | * | 2/2004 | Kim et al. | 375/341 |
| 6,788,750 B1 | * | 9/2004 | Reuven et al. | 375/341 |
| 6,934,343 B2 | * | 8/2005 | Hocevar | 375/341 |
| 2002/0010895 A1 | * | 1/2002 | Mujtaba | 714/795 |
| 2002/0021770 A1 | * | 2/2002 | Beerel et al. | 375/340 |

FOREIGN PATENT DOCUMENTS

EP 000409205 A2 * 1/1991

* cited by examiner

*Primary Examiner*—Tesfaldet Bocure
(74) *Attorney, Agent, or Firm*—L. Cho

(57) ABSTRACT

The Viterbi decoder includes a branch metric processor that determines branch metrics for states of an encoder in a time period. The Viterbi decoder includes a survivor processor that selects survivor paths between states of the encoder in consecutive time periods. The Viterbi decoder includes a normalization unit that normalizes state metrics of the states of the encoder in the time period by subtracting a constant.

19 Claims, 21 Drawing Sheets

| OUTPUT | HYPOTHESIS '0' | HYPOTHESIS '1' |
| --- | --- | --- |
| 0111 | 1111 | 0001 |
| 0110 | 1110 | 0010 |
| 0101 | 1101 | 0011 |
| 0100 | 1100 | 0100 |
| 0011 | 1011 | 0101 |
| 0010 | 1010 | 0110 |
| 0001 | 1001 | 0111 |
| 0000 | 1000 | 1000 |
| 1111 | 0111 | 1001 |
| 1110 | 0110 | 1010 |
| 1101 | 0101 | 1011 |
| 1100 | 0100 | 1100 |
| 1011 | 0011 | 1101 |
| 1010 | 0010 | 1110 |
| 1001 | 0001 | 1111 |
| 1000 | CLIPPED TO 1001 | |

FIG. 7

METHOD AND APPARATUS FOR IMPLEMENTING A VITERBI DECODER

FIELD OF THE INVENTION

The present invention relates to decoders. More specifically, the present invention relates to a method and apparatus for implementing a Viterbi decoder for decoding convolutional codes.

BACKGROUND

Viterbi decoding, also known as maximum likelihood decoding and forward dynamic programming, is one method for decoding convolutional codes. Viterbi decoding finds a sequence of bits that is closest to an actual received sequence. The Viterbi algorithm uses the redundancy imparted by a convolutional encoder to decode the bit stream and remove errors. Viterbi decoding uses an asymptotically optimum decoding technique. The decoding technique is based on the assumption that a channel is memoryless, therefore there are a finite number of possible states in a decoder, and that given two consecutive states the input bits that cause a state transition between the two consecutive states can be predicted. By creating a trellis of possible states and possible state transitions, a path through the trellis could be traced back based on information such as branch metrics and state metrics and the encoded data can be decoded.

Viterbi decoders of the past, however, suffered various drawbacks. For example, in order to address state metric storage overflow, Viterbi decoders of the past typically normalized the state metrics using traditional division techniques. Using traditional division techniques to normalize state metrics, however, proved to be problematic because these techniques required approximation and introduced errors in state metric calculations. In addition, past Viterbi decoders performed traceback from a state of an encoder having the largest state metric at a time period. In order to determine the state of an encoder with the largest state metric, the Viterbi decoders utilized a pyramid of comparators and selectors that typically required a large number of logical elements. These decoders suffered the drawback of being too large and expensive for many applications. The decoders also suffered the drawback of constraining routing due to the wide paths required for implementing comparison trees.

Thus, what is needed is an efficient and effective method and apparatus for implementing a Viterbi decoder for decoding convolutional codes.

SUMMARY

A Viterbi decoder according to a first embodiment of the present is disclosed. This Viterbi decoder reduces the errors generated during state metric calculation by utilizing an alternate normalization technique that does not require approximation. The Viterbi decoder includes a branch metric processor that determines branch metrics for states of an encoder in a time period. The Viterbi decoder includes a survivor processor that selects survivor paths between states of the encoder in consecutive time periods. The Viterbi decoder includes a normalization unit that normalizes state metrics of the states of the encoder in the time period by subtracting a constant.

A Viterbi decoder according to a second embodiment of the present invention is disclosed. This Viterbi decoder performs traceback without requiring the Viterbi decoder to compare the state metrics of states of the encoder in a time interval. This reduces the amount of logical elements required to implement this Viterbi decoder compared with Viterbi decoders of the past. The Viterbi decoder includes a branch metric processor that determines branch metrics for states of an encoder in a time period. The Viterbi decoder includes a survivor processor that selects survivor paths between states of the encoder in consecutive time periods. The Viterbi decoder includes a state metrics monitor that generates an indication that signals that a state metric of a state of the encoder in a previous time period has reached a threshold value.

BRIEF DESCRIPTION OF THE DRAWINGS

The features and advantages of the present invention are illustrated by way of example and are by no means intended to limit the scope of the present invention to the particular embodiments shown, and in which:

FIG. 7 illustrates a table storing branch metric information according to an embodiment of the present invention;

DETAILED DESCRIPTION

Figure 1:
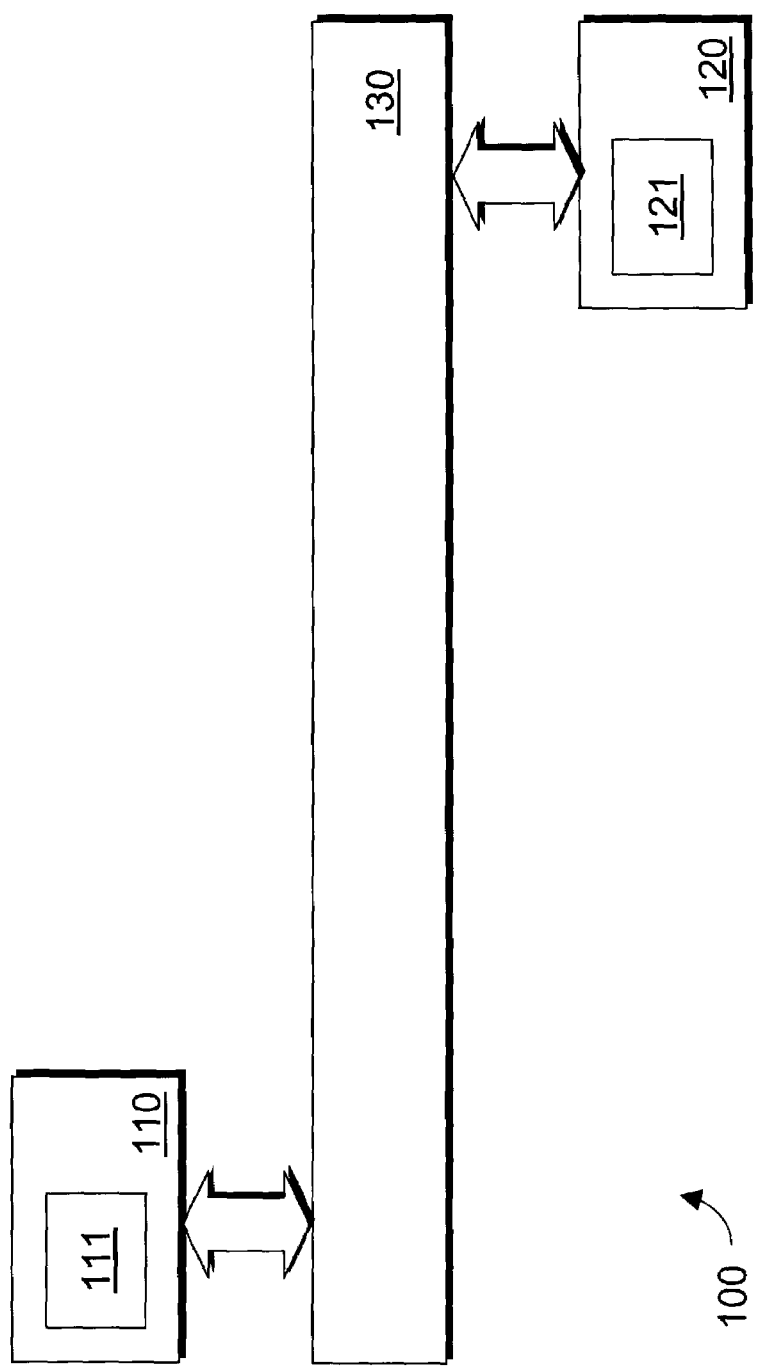
FIG. 1 is a block diagram illustrating a network implementing convolutional encoding and Viterbi decoding according to an embodiment of the present invention.

FIG. 1 is a block diagram illustrating a network 100 according to an embodiment of the present invention. The network 100 includes a data transmitter 110 and a data receiver 120. The data transmitter 110 transmits data to the data receiver 120 over transmission channel 130. Forward error correction (FEC) is used by the network 100 to improve the capacity of transmission channel 130 by adding redundant information to the data being transmitted through the transmission channel 130.

The data transmitter 110 includes a convolutional encoder 111. The convolutional encoder 111 performs the process of adding redundant information known as channel coding. The convolutional encoder 111 convolutes input bits to be transmitted onto the transmission channel 130 into output bits. According to an embodiment of the present invention, the convolutional encoder 111 includes a shift register and combinational logic that performs modulo-two addition (not shown).

Figure 2:
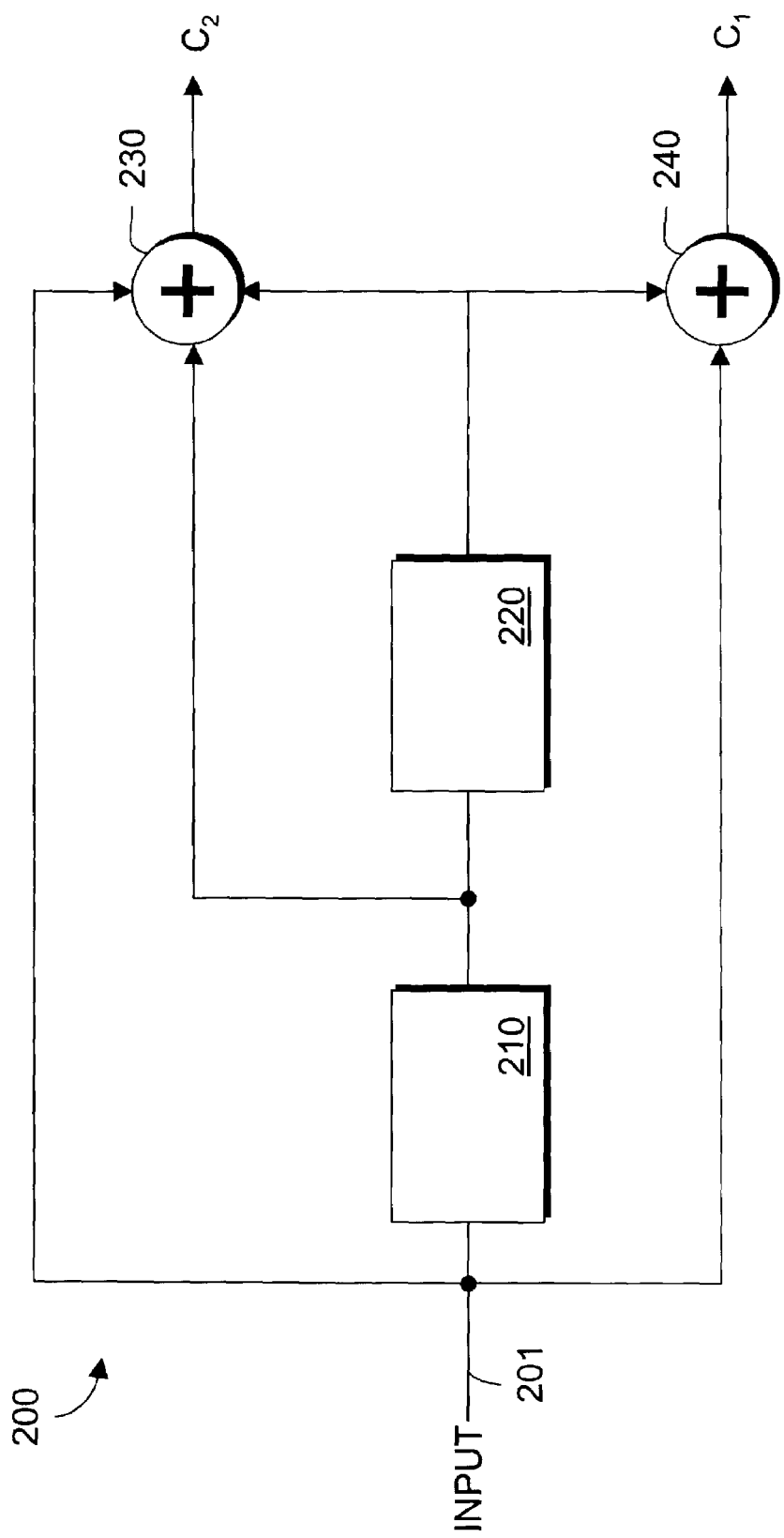
FIG. 2 is a block diagram illustrating a convolutional encoder according to an embodiment of the present invention.

FIG. 2 illustrates an exemplary convolutional encoder 200 according to an embodiment of the present invention. The convolutional encoder 200 may be implemented as the convolutional encoder 111 shown in FIG. 1. The convolutional encoder 200 includes a two-bit shift register, implemented by flip-flops 210 and 220, and circuits 230 and 240 that perform XOR functions. Input bits enter at input line 201. Outputs C2 and C1 are generated for each input bit. Output C2 is generated by performing an XOR function on all the bits in the shift register. Output C1 is generated by performing an XOR function on the input bit with the bit in flip-flop 220. The bit values stored in the flip-flops 210 and 220 define the state of the convolutional encoder 200.

Typically, a convolutional encoder can be characterized by its rate and the generating polynomials. A convolutional encoder's rate is defined as the number of transmitted bits per input bit, e.g., a rate ½ encodes 1 bit and produces 2 bits for transmission. A convolutional encoder's generating polynomials denote the convolutional encoder state bits which are mathematically combined to produce an encoded bit. There is one generating polynomial per encoded bit. The length in bits of the generating polynomial is called the constraint length. The exemplary convolutional encoder 200 shown in FIG. 2 includes L-1 bit stages and n linear algebraic function generators where there are n number of output bits for each k-bit input sequence. The code rate of the convolutional encoder 200 is ½ and the constraint length of the convolutional code is 3. It should be appreciated that the convolutional encoder 200 may be implemented using other known circuitry and techniques and that convolutional encoder 200 may be implemented to have other code rates and constraint lengths.

Figure 3:
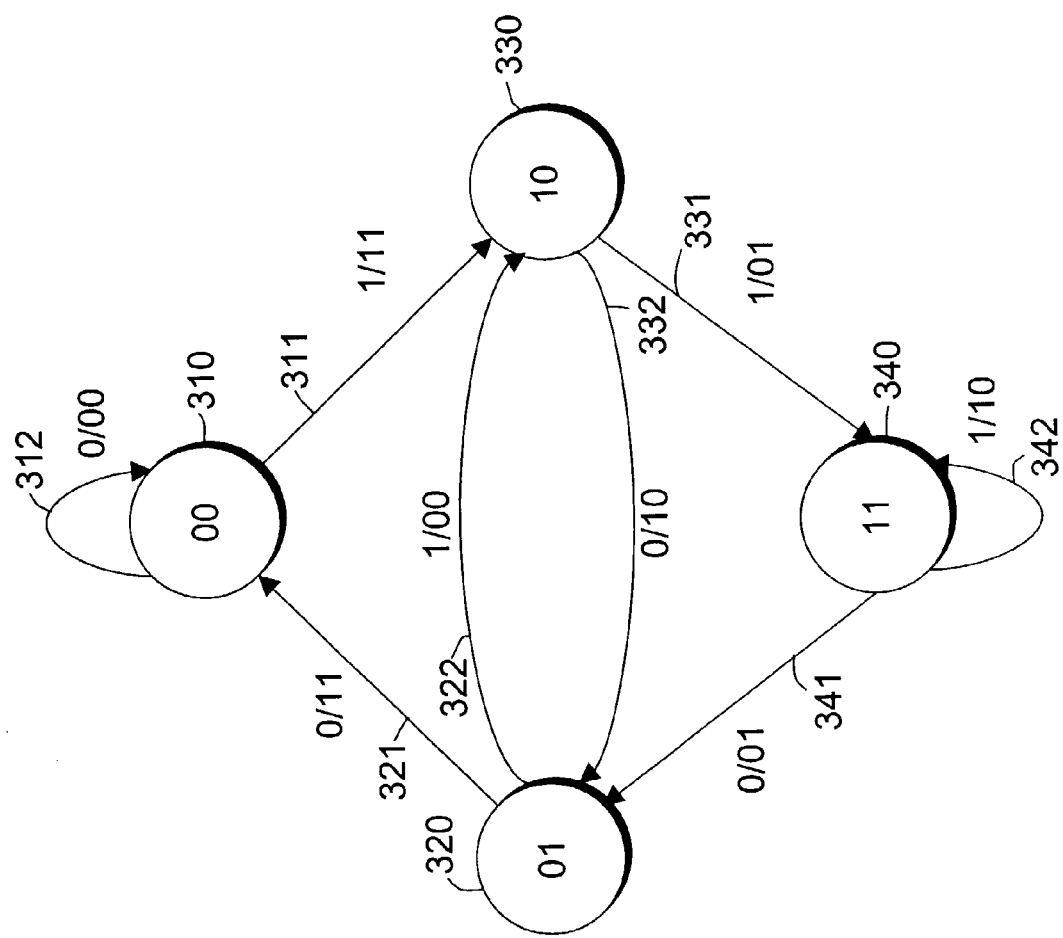
FIG. 3 is a state diagram illustrating the states of the convolutional encoder in FIG. 2.

FIG. 3 is a state diagram 300 illustrating the states of the convolutional encoder 200 shown in FIG. 2. The circles 310, 320, 330, and 340 represent states of the convolutional encoder 200. The values along the arrows in FIG. 3 represent the input and output bits of the encoder. Circle 310 represents state 00. While in state 00, if an input bit to the encoder 200 is 0, the output of the encoder 200 will be 00 and the next state will again be 00. While in state 00, if an input bit to the encoder 200 is 1, the output of the encoder will be 11 and the next state will be 10. Circle 320 represents state 01. While in state 01, if an input bit to the encoder 200 is 0, the output of the encoder 200 will be 11 and the next state will be 00. While in state 01, if an input bit to the encoder 200 is 1, the output of the encoder will be 00 and the next state will be 10. Circle 330 represents state 10. While in state 10, if an input bit to the encoder 200 is 0, the output of the encoder 200 will be 10 and the next state will be 01. While in state 10, if an input bit to the encoder 200 is 1, the output of the encoder will be 01 and the next state will be 1. Circle 340 represents state 11. While in state 11, if an input bit to the encoder 200 is 0, the output of the encoder 200 will be 01 and the next state will be 01. While in state 11, if an input bit to the encoder 200 is 1, the output of the encoder will be 10 and the next state will again be 11.

Figure 4:
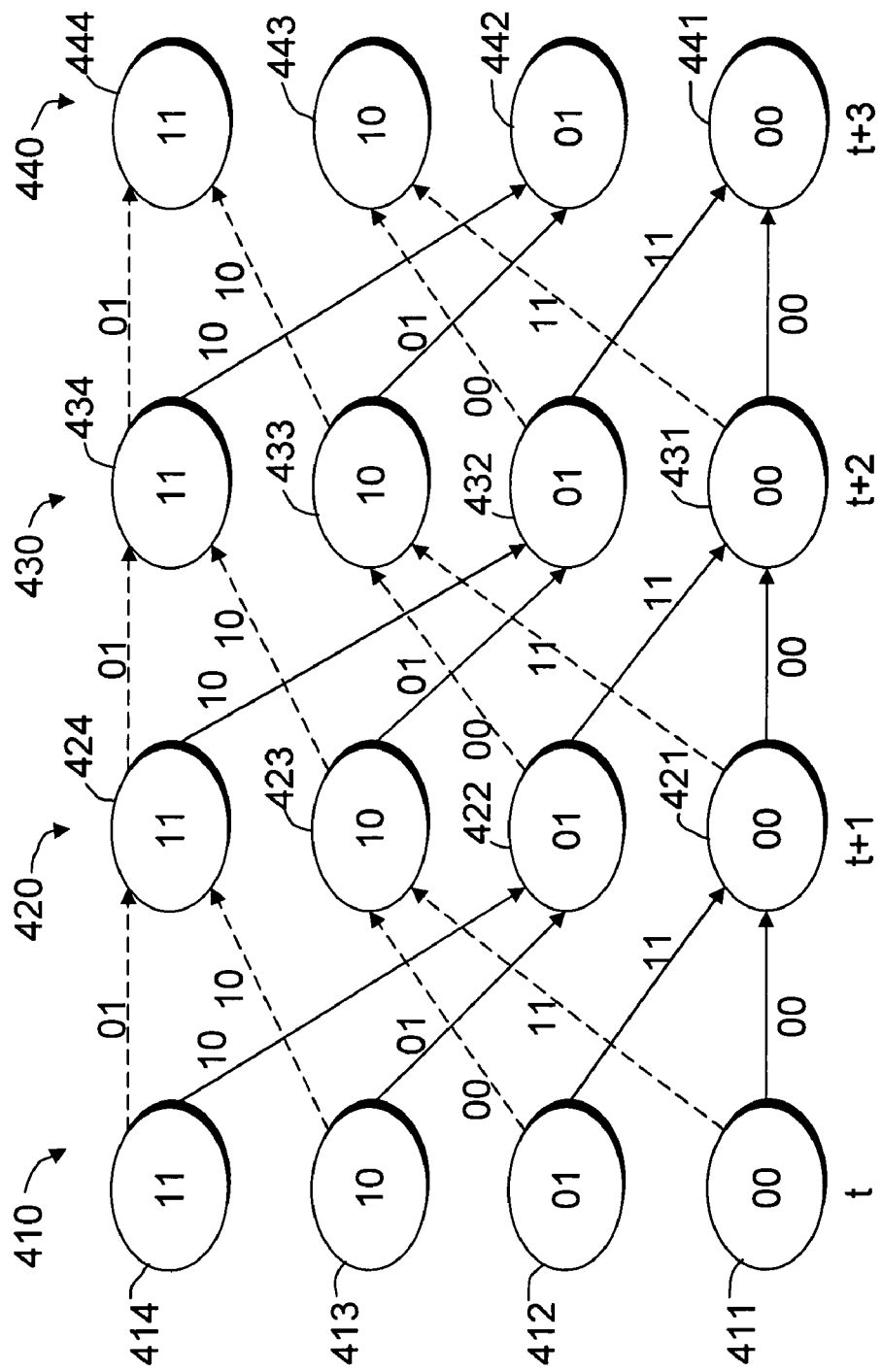
FIG. 4 is a trellis diagram illustrating the states of the convolutional encoder in FIG. 2 over a period of four time intervals.

FIG. 4 is a trellis diagram illustrating the states of the convolutional encoder 200 shown in FIG. 2. The trellis diagram illustrates the possible states of the convolutional encoder 200 during four time periods. A first column of circles 410 includes circles 411–414 that represent possible states 00, 01, 10, and 11 respectively. The first column of circles 410 represents possible states of the convolutional encoder 200 during time period t. A second column of circles 420 includes circles 421–424 that represent possible states 00, 01, 10, and 11 respectively. The second column of circles 420 represents possible states of the convolutional encoder 200 during time period t+1. A third column of circles 430 includes circles 431–434 that represent possible states 00, 01, 10, and 11 respectively. The third column of circles 430 represents possible states of the convolutional encoder 200 during time period t+2. A fourth column of circles 440 includes circles 441–444 that represents possible states 00, 01, 10, and 11 respectively. The fourth column of circles 440 represent possible states of the convolutional encoder 200 during time period t+3.

Each of the possible states represented by circles 411–414, 421–424, and 431–434 has a dotted arrow and a solid arrow extending to a circle that represent another state in the next time period. The dotted arrow represents a path to a state in the next time period when the input bit to the convolutional encoder 200 is 1. The solid arrow represents a path to a state in the next time period when the input bit to the convolutional encoder is 0. The output values (C1, C2) generated by the convolutional encoder 200 in response to the inputs are shown next to the arrows. Although FIG. 4 shows a trellis diagram of the possible states during four time intervals, it should be appreciated that a time interval may be shown for each output of the convolutional encoder 200.

Referring back to FIG. 1, the data receiver 120 includes a Viterbi decoder 121. According to an embodiment of the present invention, The Viterbi decoder 121 decodes the encoded data received from the data transmitter 110 by creating a trellis of possible states and possible state transitions, and tracing back a path through the trellis based on branch metric and state metric calculations. According to an embodiment of the data receiver 120, the Viterbi decoder 121 includes a state metrics processor and a traceback processor (not shown). It should be appreciated that the data transmitter 110 and the data receiver 120 may be configured to transmit and receive and encode and decode data.

Figure 5:
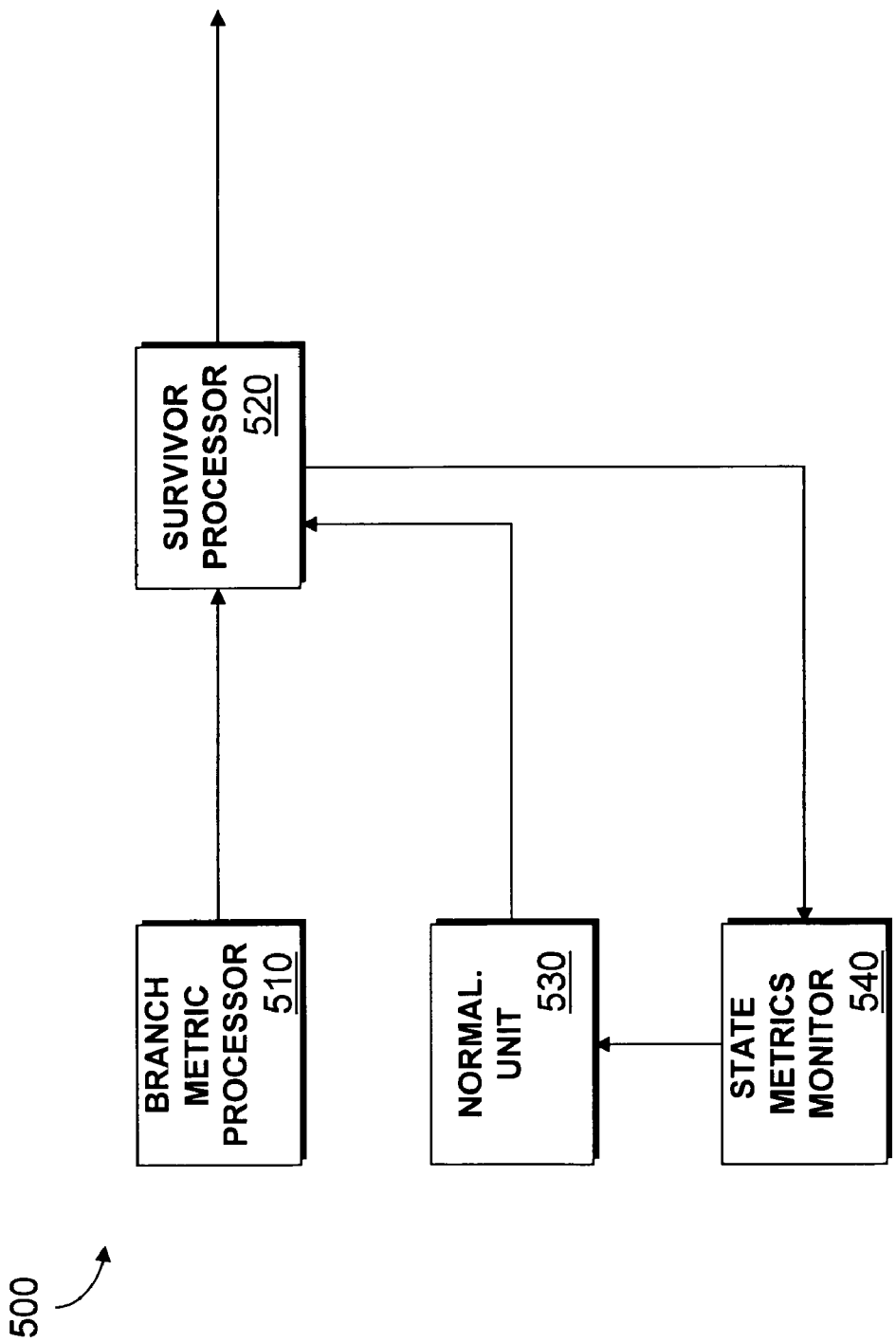
FIG. 5 is a block diagram of a state metrics processor according to an embodiment of the present invention.

FIG. 5 is a block diagram of a state metric processor 500 according to an embodiment of the present invention. The state metric processor 500 may be implemented in the Viterbi decoder 121 shown in FIG. 1. The state metric processor 500 includes a branch metric processor 510. The branch metric processor 510 receives the output bits transmitted by the data transmitter 110 during a time period and determines the branch metrics associated with possible states of the convolutional encoder 200 (shown in FIG. 2) during the time period. According to an embodiment of the state metric processor 500, the branch metric processor 510 includes a plurality of branch metric calculation units (not shown). Each branch metric calculation unit calculates the branch metrics for paths leading to a state of the convolutional encoder 200. According to an embodiment of the state metric processor 500, the branch metric processor 510 determines Correlation metrics.

Figure 6:
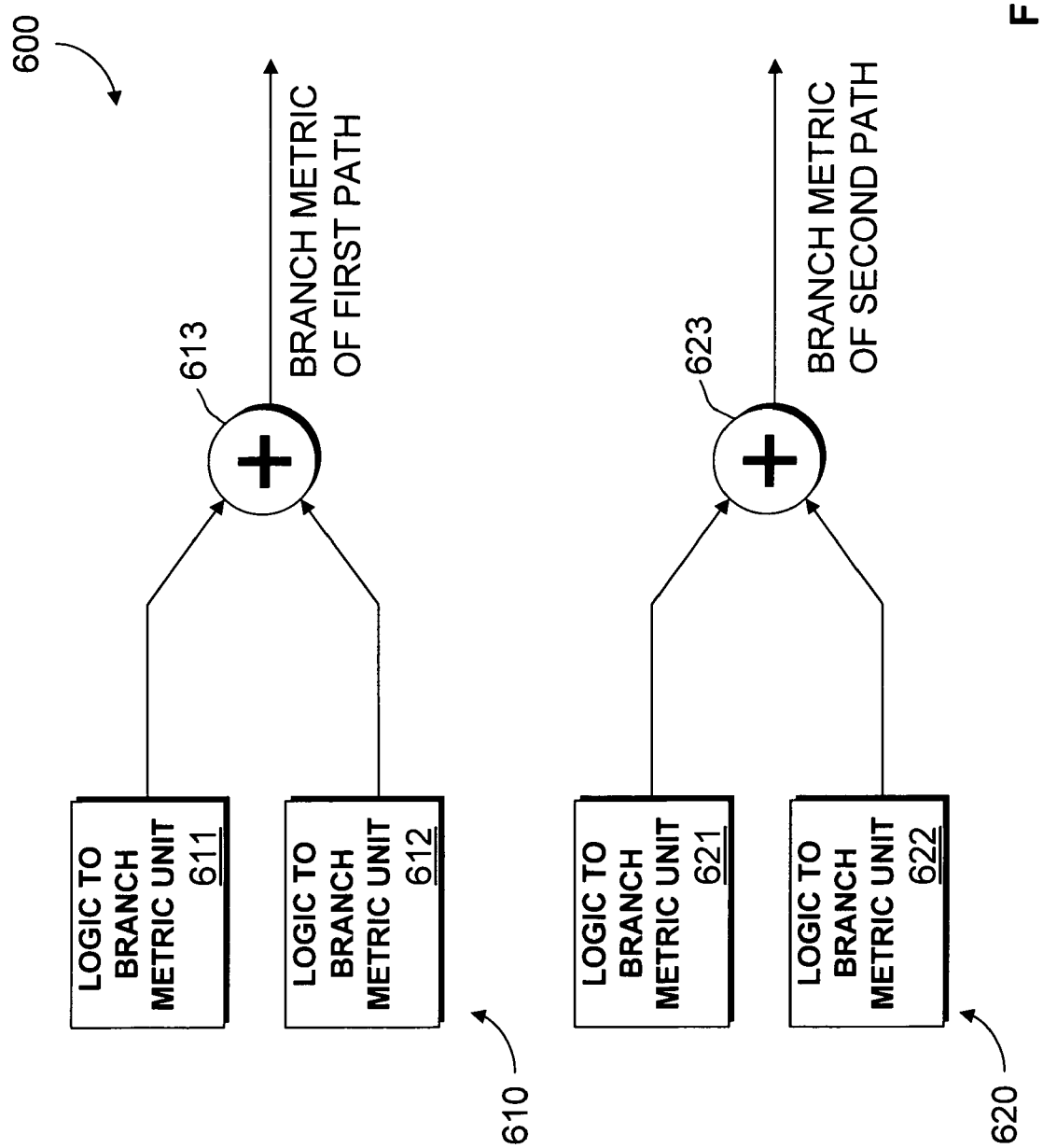
FIG. 6 is a block diagram of branch metric calculation unit according to an embodiment of the present invention.

FIG. 6 illustrates an exemplary branch metric calculation unit 600 according to an embodiment of the present invention. The branch metric calculation unit 600 may be implemented in the branch metric processor 510 shown in FIG. 5. The branch metric calculation unit 600 includes a plurality of metric processors 610 and 620 where each metric processor 610 and 620 includes a plurality of logic to branch metric units. Metric processor 610 includes logic to branch metric units 611 and 612. Metric processor 620 includes logic to branch metric units 621 and 622. According to an embodiment of the present invention, each branch metric calculation unit 600 has $2^k$ metric processors and each metric processor has n logic to branch metric units where n is the number of output bits generated for k input bits by the convolutional encoder at a data transmitter. In the example shown, k=1. Each metric processor calculates the branch metrics associated with a path to a state of the convolutional encoder 200 from a state from a previous time period. Each logic to branch metric unit retrieves branch metric information corresponding to one of the output bits and an expected output of the convolutional encoder 200.

Each metric processor 610 and 620 includes an adder. Metric processor 610 includes adder 613 and metric processor 620 includes adder 623. Adder 613 sums the branch metric information retrieved from logic to branch metric units 611 and 612 to generate a branch metric associated to a first path to a state. Adder 623 sums the branch metric information retrieved from logic to branch metric units 621 and 622 to generate a branch metric associated to a second path to the state.

According to an embodiment of the branch metric calculation unit 600, the logic to branch metric units 611–612, and 621–622 may retrieve branch metric information from a table stored external to the branch metric calculation unit 600. Alternatively, each logic to branch metric units 611–612, and 621–622 may store internally a table having branch metric information. FIG. 7 illustrates a table that stores exemplary branch metric information according to an embodiment of the present invention. The table has an "output column" that list output bits that may be received by the logic to branch metric units. The table has a "hypothesis '0'" and a "hypothesis '1'" which list branch metric information associated with an output bits having a corresponding expected output from a convolutional encoder.

Referring back to FIG. 4, a table of branch metric information, such as that illustrated in FIG. 7, may be used to determine branch metric information for any of the states 421–424, 431–434, and 441–444. For example, given that 2 output bits DC (hex format) were received at time period t+1, the branch metrics for the paths to state 00 at time period t+1 may be determined. Two paths lead to state 00 at time period t+1. A first path from state 01 at time period t and a second path from state 00 at time period t lead to state 00 at time period t+1. The first path has the associated output values or hypotheses of 11. For the output bit D (1101 in binary) a hypothesis of 1 yields a value of 1011. For the output bit of C (1100 in binary) a hypothesis of 1 yields a value of 1100. Summing the branch metric information values 1011 and 1100 generates the branch metric value 23 for the first path. The second path has the associated output value or hypothesis of 00. For the output bit D (1101 in binary) a hypothesis of 0 yields a value of 0101. For the output value of C (1100 in binary) a hypothesis of 0 yields a value of 0100. Summing the branch metric information values 0101 and 0100 generates the branch metric value 9 for the second path.

Figure 8:
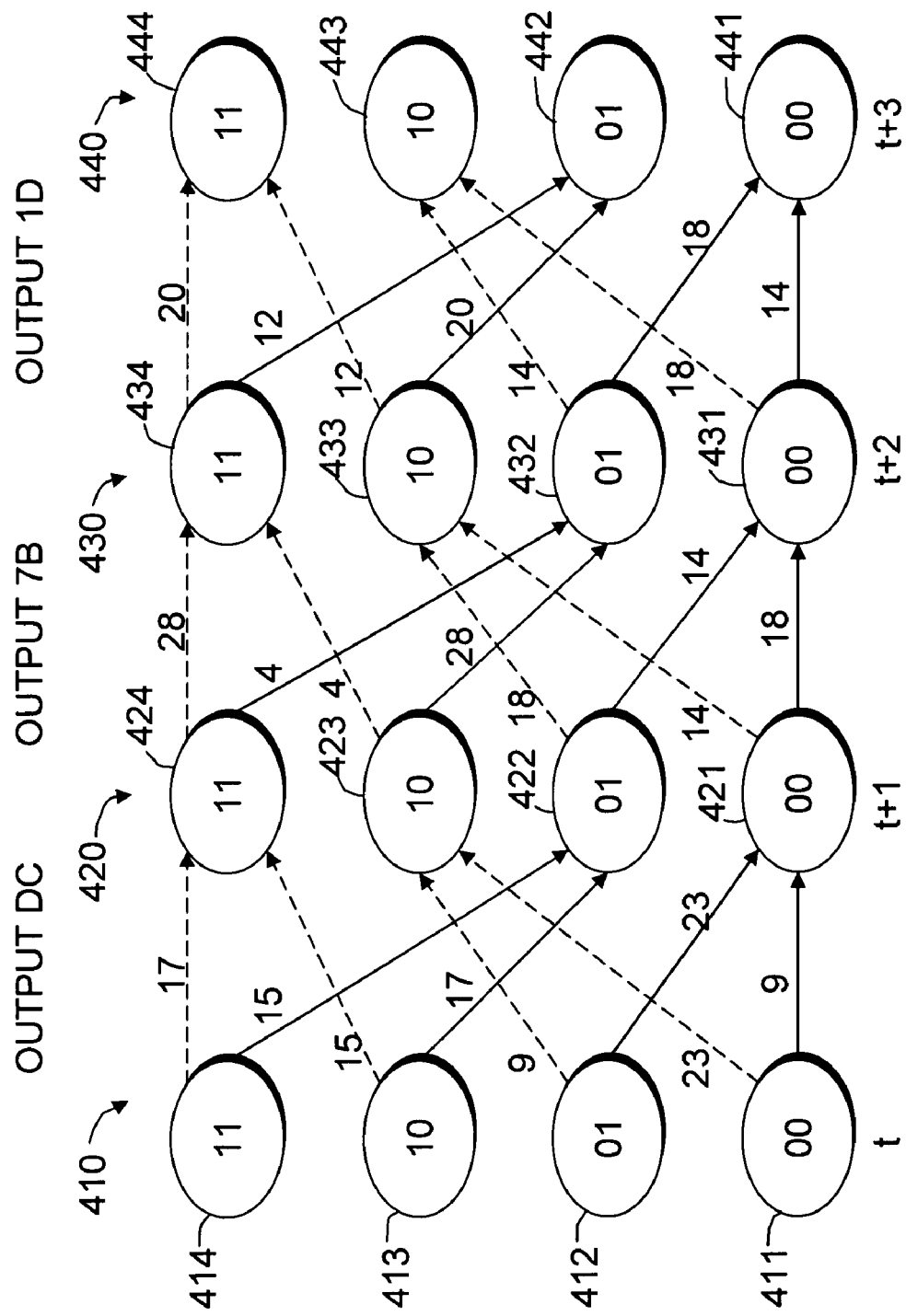
FIG. 8 is a trellis diagram illustrating the branch metrics calculated for the paths between states.

FIG. 8 is a trellis diagram that illustrates the branch metrics value for the paths that lead to the states during time interval t+1 through t+3 as determined by the branch metrics processor 510. In this example, output values 7B and 1D are received at time periods t+2 and t+3 respectively. The branch metric value for each path are shown next to each path.

Referring back to FIG. 5, the state metric processor 500 includes a survivor processor 520. The survivor processor 520 receives the branch metrics associated with paths to the states of the convolutional encoder 200 from the branch metric processor 510. The survivor processor 520 determines the state metrics for the states and survivor paths leading to each state. According to an embodiment of the state metric processing unit 500, the survivor processor 520 determines the state metric of a state by summing the branch metric for each path to the state with the state metric of the state originating the path, and selecting the sum having the larger value as the state metric for the state. The path associated with the state metric value is designated as the survivor path leading to the state. According to an embodiment of the state metric processing unit 500, the survivor processor 520 includes an add, compare, select (ACS) units (not shown) for each state of the convolutional encoder.

Figure 9:
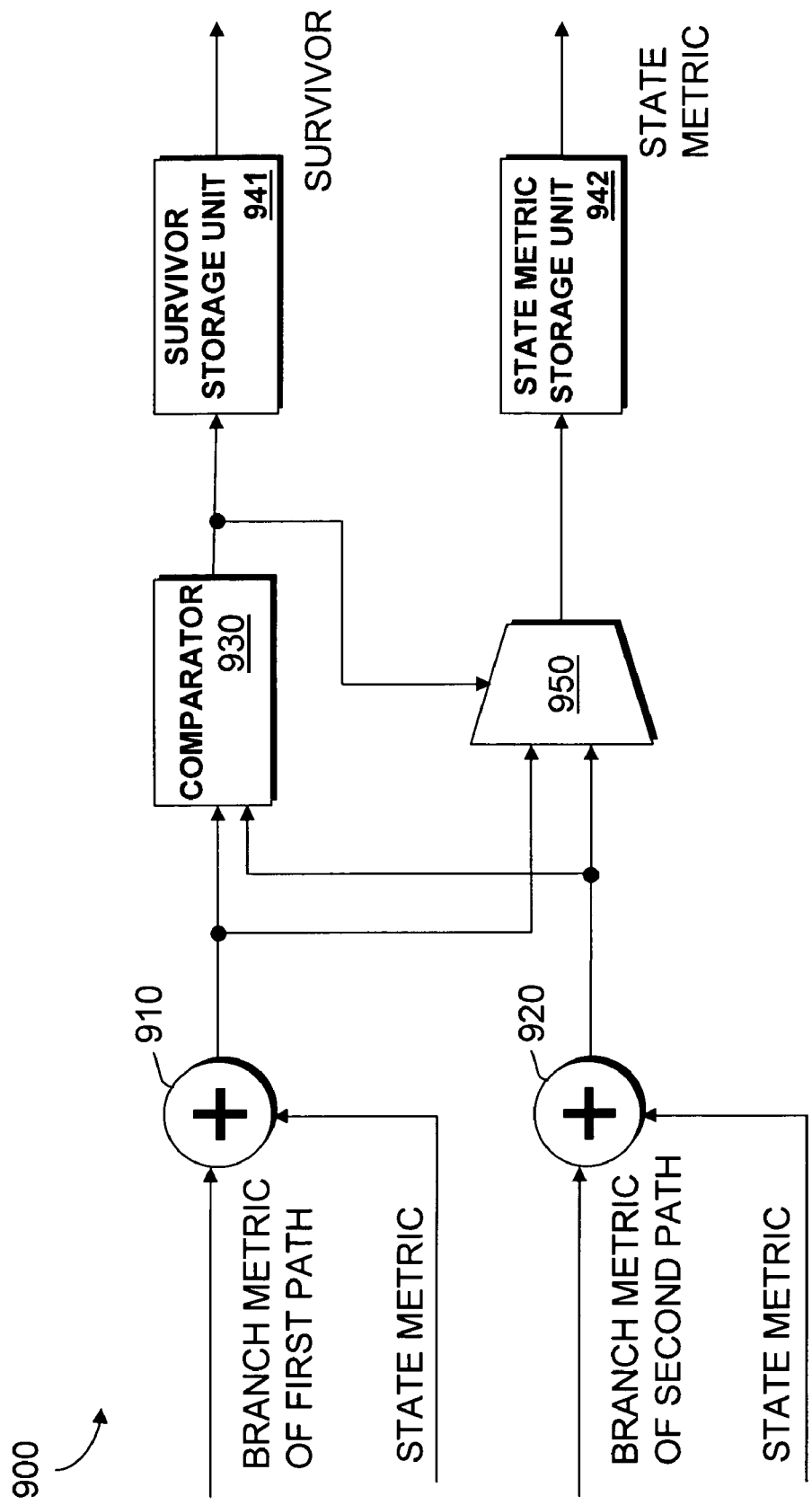
FIG. 9 is a block diagram of an add, compare, select (ACS unit) according to an embodiment of the present invention.

FIG. 9 is a block diagram of a ACS unit 900 for processing a state metric of a state and a survivor path leading to the state according to an embodiment of the present invention. The ACS unit 900 may be implemented in the survivor processor 520 shown in FIG. 5. The ACS unit 900 shown in FIG. 9 includes adder circuits 910 and 920. According to an embodiment of the present invention, each ACS unit includes $2^k$ adder circuits where k is the number of input bits at the convolutional encoder at a data transmitter. The adder circuit 910 receives the branch metric for a first path leading to the state and the state metric for the state originating the first path. The adder circuit 910 sums the branch metric value with the state metric value to generate a first contender value. The adder circuit 920 receives the branch metric for a second path leading to the state and the state metric for the state originating the second path. The adder circuit 920 sums the branch metric value with the state metric value to generate a second contender value.

The ACS unit 900 includes a comparator 930. The comparator 930 receives the first and second contender values from adder circuits 910 and 920 and determines which of the contender values is the largest. The largest contender value is designated as the state metric for the state and the path associated with the largest contender value is designated as the survivor path. The ACS unit 900 includes a survivor storage unit 941 that stores the identity of the survivor path.

The ACS unit 900 includes a multiplexer 950. The multiplexer 950 receives the first and second contender values from adder circuits 910 and 920 and selects the largest contender value to be output in response to a select signal from the comparator 930. The ACS unit 900 includes a state metric storage unit 942 that stores the state metric for the state.

Figure 10:
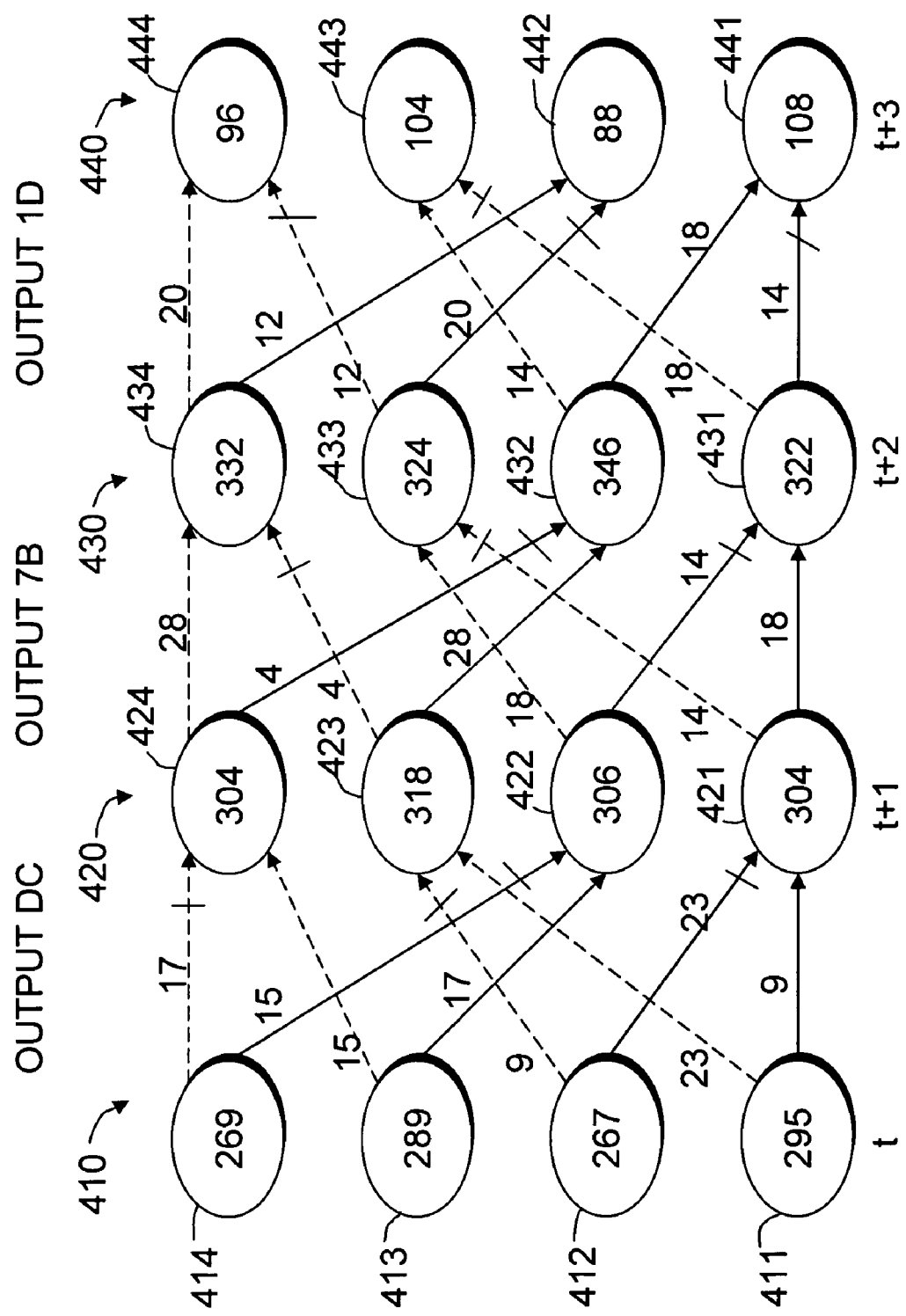
FIG. 10 is a trellis diagram that illustrating the state metrics and survivor paths determined for the states.

FIG. 10 is a trellis diagram that illustrates the state metrics and survivor paths for the states during time interval t+1 through t+3 as determined by the survivor processor 520. The state metrics for states 00, 01, 10, and 11 at time period t, represented by circles 411–414, are assigned values 295, 267, 289, and 269 for the purposes of this example. The state metric values for each state are shown inside the circle representing the state. Each non-surviving path to a state is marked with a line through it.

Referring back to FIG. 5, the state metric processing unit 500 includes a normalization unit 530. The normalization unit 530 manages the state metric storage units in the ACS units of the survivor processor 520. The normalization unit 530 normalizes the state metric values stored in the state metric storage units to prevent data overflow. According to an embodiment of the state metric processing unit 500, the normalization unit 530 subtracts a constant from the state metric values stored in all of the state metric storage units when all the state metric values exceed a threshold value. In one embodiment, the normalization unit 530 zeros (de-asserts) the most significant bit of contender values that are contenders to be state metric values. According to an embodiment of the metric processing unit 500, the normalization unit 530 includes $2^{L-1}$ normalization circuits where L-1 is the number of flip-flops or the length of the shift register at the convolutional encoder at a data transmitter.

Figure 11:
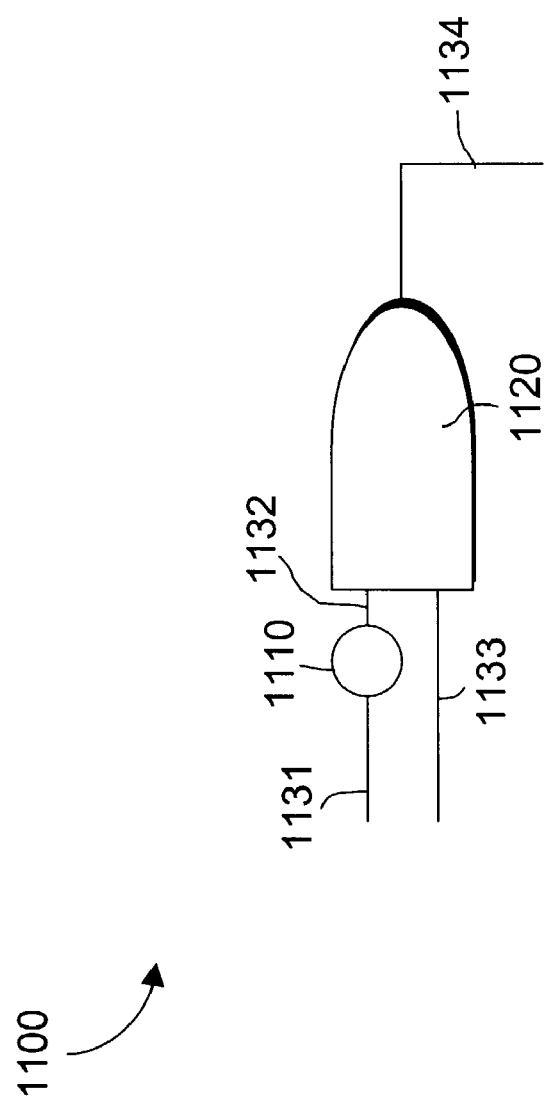
FIG. 11 illustrates a normalization circuit according to an embodiment of the present invention.

FIG. 11 illustrates a normalization circuit 1100 according to an embodiment of the present invention. The normalization circuit 1100 may be implemented in the normalization unit 530 shown in FIG. 5. The normalization circuit 1100 includes a first circuit 1110 that operates as an inverter. The first circuit 1110 receives a normalization signal at its input 1131 when the normalization circuit 1100 is to normalize a state metric value. The normalization circuit 1100 includes a second circuit 1120 that performs an ANDing function. A first input 1132 to the second circuit 1120 is coupled to the output of the first circuit 1110. A second input 1133 of the second circuit 1120 is coupled to a line transmitting the most significant bit of a contender value that is a contender to be a state metric value. When the normalization signal is not asserted, the output 1134 of the second circuit 1120 reflects the most significant bit of the contender value. When the normalization signal is asserted, the most significant bit of the contender value becomes a zero. This has the effect of subtracting a constant from the contender value.

According to an embodiment of the state metric processor 500, the normalization circuit 1100 may be coupled to each adder circuit in the survivor processor 900 (shown in FIG. 9). With reference to FIG. 9, input line 1133 and output line 1134 of a first normalization circuit may be coupled to the output of the adder circuit 910. Similarly, input line 1133 and output line 1134 of a second normalization circuit may be coupled to the output of the adder circuit 920. In response to a normalization signal, the first and second normalization circuits would manipulate the signal representing the most significant bit and operate to subtract a constant value from the first and second contender value.

Referring back to FIG. 5, the state metrics processor 500 includes a state metrics monitor 540. According to an embodiment of the state metrics processor 500, the state metrics monitor 540 includes an normalization initiator (not shown) that monitors the most significant bit of the state metrics of states during a previous time period. The normalization initiator determines whether the most significant bit of the state metrics of all the states during a time period is high. The normalization initiator generates a normalization signal to the normalization unit 530 in response to the determination. According to an embodiment of the state metrics processor 500, the state metrics monitor 540 includes a half-range crossing detector (not shown) that determines whether the most significant bit of the state metrics of any of the states during the previous time period is high (asserted). The state metrics monitor 540 generates a normalization pulse in response to the determination.

Figure 12:
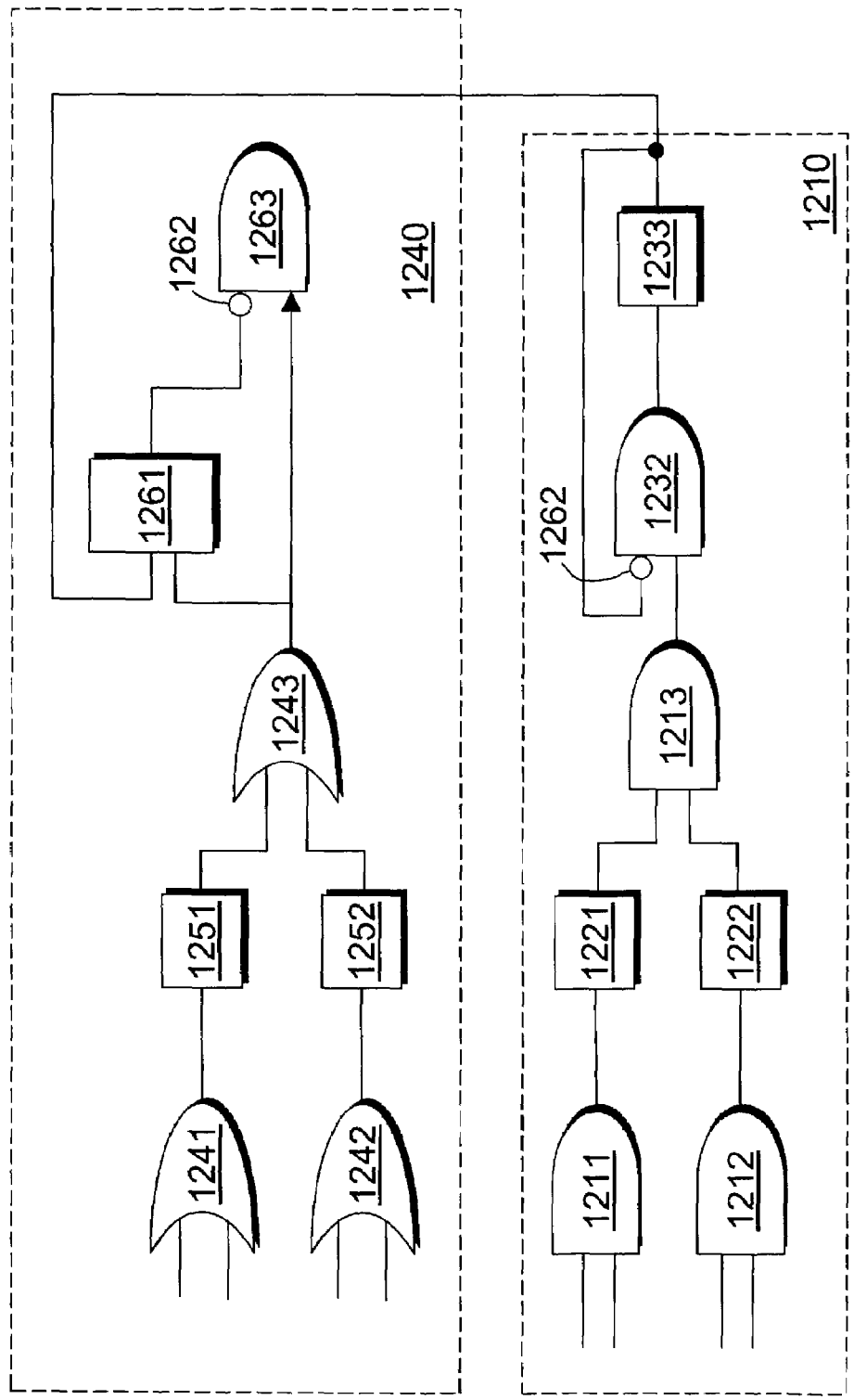
FIG. 12 illustrates a state metrics monitor according to an embodiment of the present invention.

FIG. 12 illustrates a state metrics monitor 1200 according to an embodiment of the present invention. The state metrics monitor 1200 may be implemented as the state metrics monitor 540 shown in FIG. 5. The state metrics monitor 1200 includes a normalization initiator 1210. The normalization initiator 1210 includes circuits 1211–1213 that each perform an ANDing function. Together, the circuits 1211–1213 form an AND tree that performs an all-wide-AND function. The output of circuit 1213 is high only when the inputs to circuits 1211 and 1212 are high. According to an embodiment of the state metrics processor 500, the inputs to circuits 1211 and 1212 are the most significant bits of the state metrics of states during a previous time period. It should be appreciated that additional circuits may be added to the normalization initiator 1210 to expand the AND tree if a convolutional encoder generating output bits to the data receiver 120 (shown in FIG. 1) supported additional states. The normalization initiator 1210 may also include a plurality of flip-flops 1221 and 1222 to optionally store states of the circuits 1211 and 1212. The normalization initiator 1210 may also optionally include additional circuitry that prevents the normalization initiator from generating a normalization signal during consecutive time periods. According to an embodiment of the normalization initiator 1210, the additional circuitry may include a circuit 1231 that performs an inversion function, a circuit 1232 that performs an ANDing function, and a flip-flop 1233.

The state metrics monitor 1200 includes a half-range crossing detector 1240. The half-range crossing detector 1240 includes circuits 1241–1243 that each perform an ORing function. Together, the circuits 1241–1243 form an OR tree that performs an all-wide-OR function. The output of circuit 1243 is high when any of the inputs to circuits 1241 and 1242 are high. According to an embodiment of the state metrics processor 500, the inputs to circuits 1241 and 1242 are the most significant bits of the state metrics of states during a previous time period. It should be appreciated that additional circuits may be added to the half-range crossing detector 1240 to expand the OR tree if a convolutional encoder generating output bits to the data receiver 120 (shown in FIG. 1) supported additional states. The half-range crossing detector 1240 may also include a plurality of flip-flops 1251 and 1252 to optionally store states of the circuits 1241 and 1242. The half-range detector 1240 may also optionally include additional circuitry that prevents the half-range crossing detector 1240 from generating consecutive normalization pulses before the normalization initiator 1210 generates a normalization signal. According to an embodiment of the half-range crossing detector 1240, the additional circuitry may include an finite state machine 1261, a circuit 1262 that performs an inversion function, and a circuit 1263 that performs an ANDing function. It should be appreciated that the normalization initiator 1210 and the half-range crossing detector 1240 may be implemented using other known techniques or circuitry, and that the state metrics monitor 1200 may implement both the normalization initiator 1210 and the half-range crossing detector 1240 or only one of the two.

Referring back to FIG. 5, it should be appreciated that the branch metrics processor 510, survivor processor 520, normalization unit 530, and state metrics monitor 540 may be implemented using any known techniques or circuitry. According to an embodiment of the present invention, the branch metrics processor 510, survivor processor 520, normalization unit 530, and state metrics monitor 540 all reside on a single semiconductor substrate.

Figure 13:
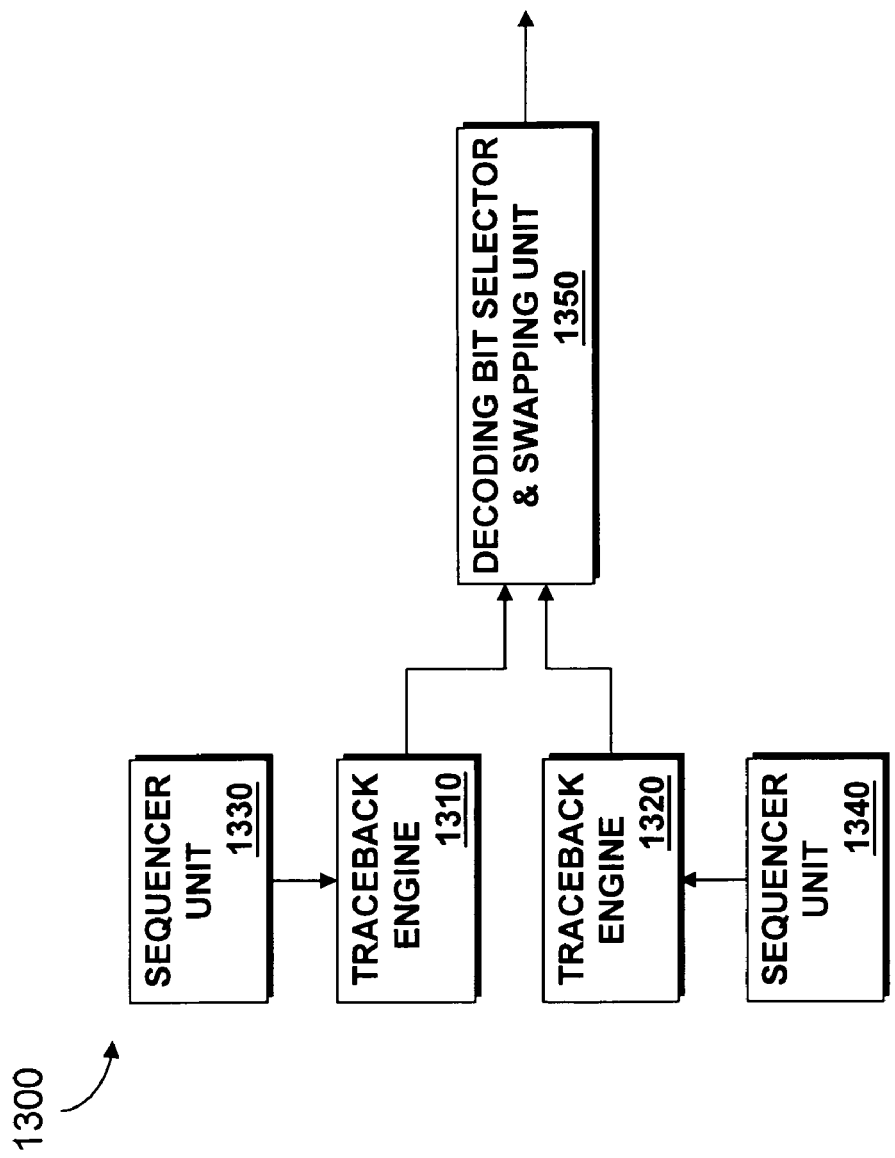
FIG. 13 illustrates a traceback processor according to an embodiment of the present invention.

FIG. 13 is a block diagram of a traceback processor 1300 according to an embodiment of the present invention. The traceback processor 1300 may be implemented in the Viterbi decoder 121 shown in FIG. 1. The traceback processor 1300 includes traceback engines 1310 and 1320. The traceback engines 1310 and 1320 process survivor information stored in memory and tracks the state of the tracing back operation. The traceback processor 1300 includes sequencer units 1330 and 1340. The sequencer units 1330 and 1340 generate addresses for writing and reading survivor information between the memory into the traceback engines 1310 and 1320. The sequencer units 1330 and 1340 also includes timing logic that controls the timing of the tampering process of the traceback operation. The traceback processor 1300 includes a decoding bit selector and swapping unit 1350. The decoding bit selector and swapping unit 1350 decodes data from the traceback engines one bit at a time and swaps the order of the decoded bits to correctly order the decoded bits.

Figure 14:
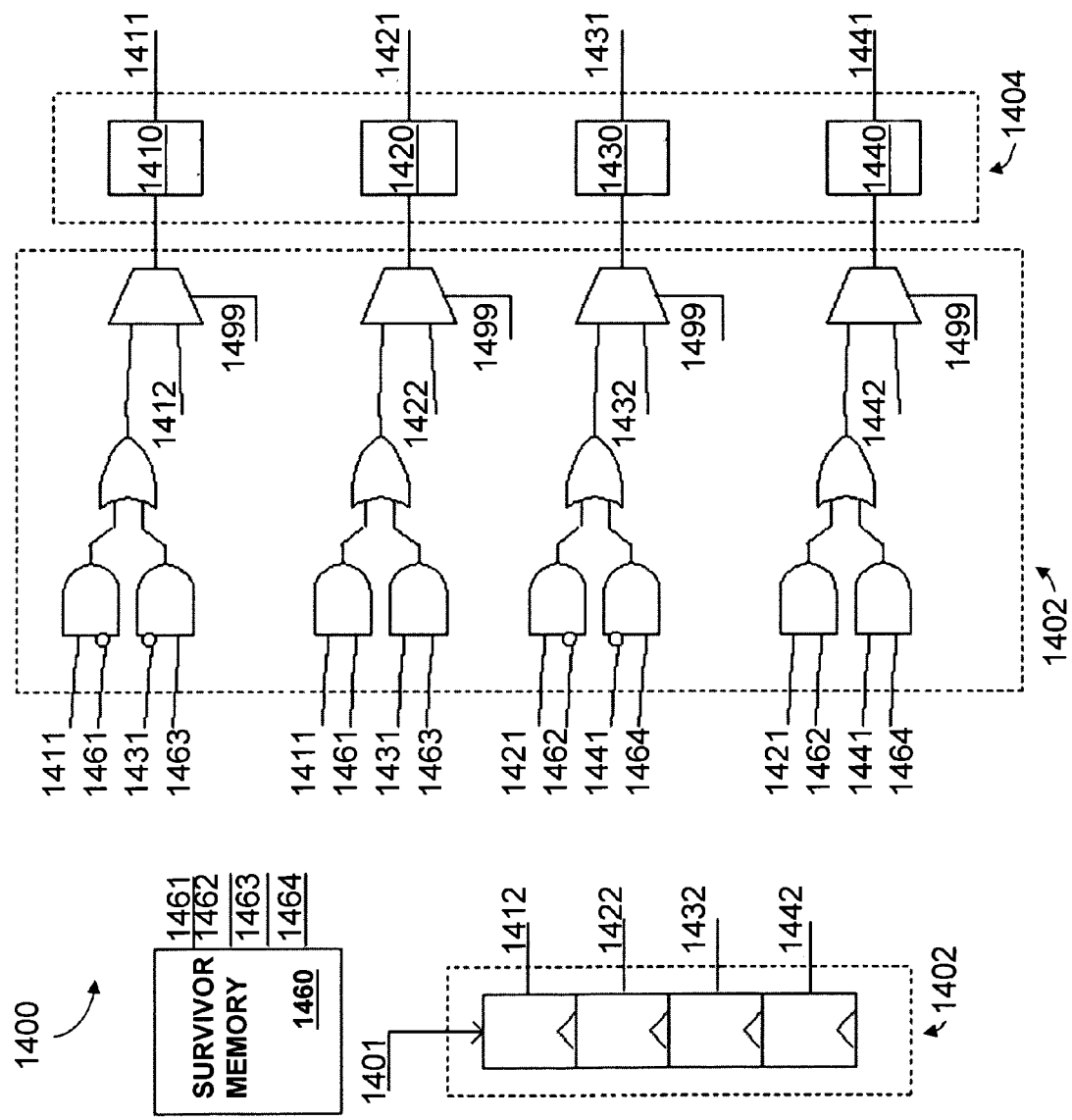
FIG. 14 illustrates a traceback engine according to an embodiment of the present invention.

FIG. 14 illustrates an exemplary traceback engine 1400 according to an embodiment of the present invention. The traceback engine 1400 may be implemented in the traceback processor shown in 1300. The traceback engine 1400 includes a snapshot register 1402 that stores a snapshot of the most significant bit of the state metrics when a half-range crossing has occurred. The occurrence of the half-range crossing is signaled on line 1401 by an indication generated by half-range crossing detector 1240 (shown in FIG. 12). The traceback engine 1400 includes a traceback register 1404 that stores the state of the traceback operation. According to one embodiment, the traceback register 1404 is implemented using a plurality of flip-flops 1410, 1420, 1430, and 1440. The traceback engine 1400 includes a survivor memory 1460 that stores survivor information such as successive survivors from state metric processor 500 (shown in FIG. 5). The traceback engine 1400 includes operation logic 1403. The operation logic 1403 includes combinational logic that include a plurality of components that perform OR, AND, inversion, and multiplexing operations. The operation logic 1403 determines the state of the traceback engine at a next time period from the current state stored in snapshot register 1402 and the outputs from survivor memory 1460. When a tampering signal is input to the operation logic 1403 on line 1499, the content of snapshot register 1402 is loaded onto the state of the traceback engine (traceback register 1404). This process is known as traceback tampering.

Figure 15:
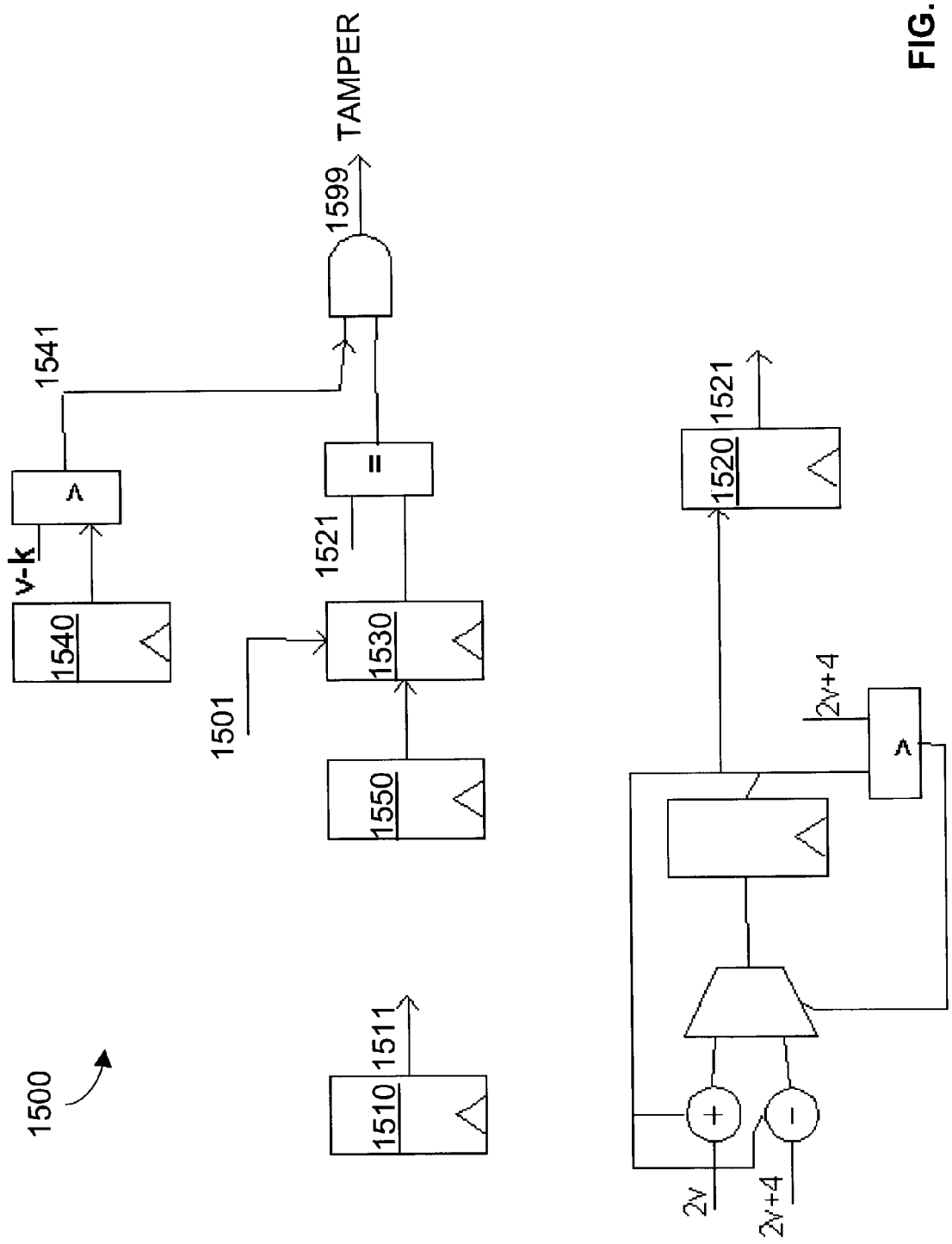
FIG. 15 illustrates a sequencer unit according to an embodiment of the present invention.
Figure 19:
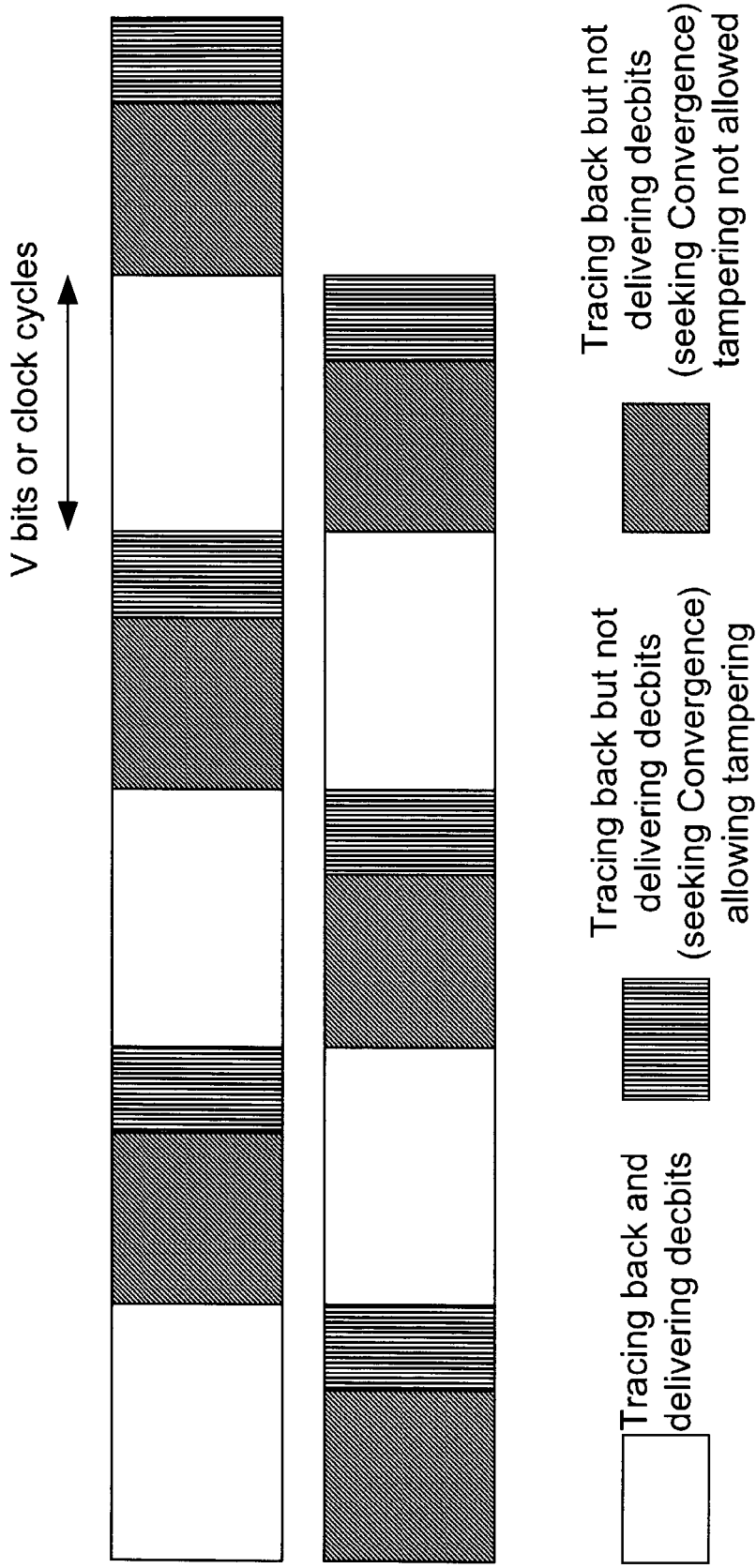
FIG. 19 illustrates when tampering is permitted during the traceback process.

FIG. 15 illustrates an exemplary sequencer unit 1500 according to an embodiment of the present invention. The sequencer unit 1500 may be implemented in the traceback processor shown in FIG. 13. The sequencer 1500 includes a first counter 1510. The first counter 1510 generates addresses to be written to survivor memory 1460 (shown in FIG. 14). The sequencer unit 1500 includes a second counter 1520 that generates addresses to be read from survivor memory 1460. The sequencer unit 1500 includes a third counter 1550 that generates a delayed version of the output from the first counter 1510. The sequencer unit 1500 includes a register 1530 that stores the time when the half-range crossing occurs. The half-range crossing occurrence is signaled by an indication on line 1501. This indication is generated by the half-range crossing detector 1240 (shown in FIG. 12). The sequencer 1500 includes a fourth counter 1440 that assists in marking the boundaries of the time periods when tampering is allowed. FIG. 19 illustrates an exemplary boundaries marked by the sequencer 1500. A tamper signal that prompts tampering of the traceback is asserted on line 1599. The tamper signal is generated when tampering is allowed and when the read address is equal to a time of the last half-crossing occurrence.

Figure 16:
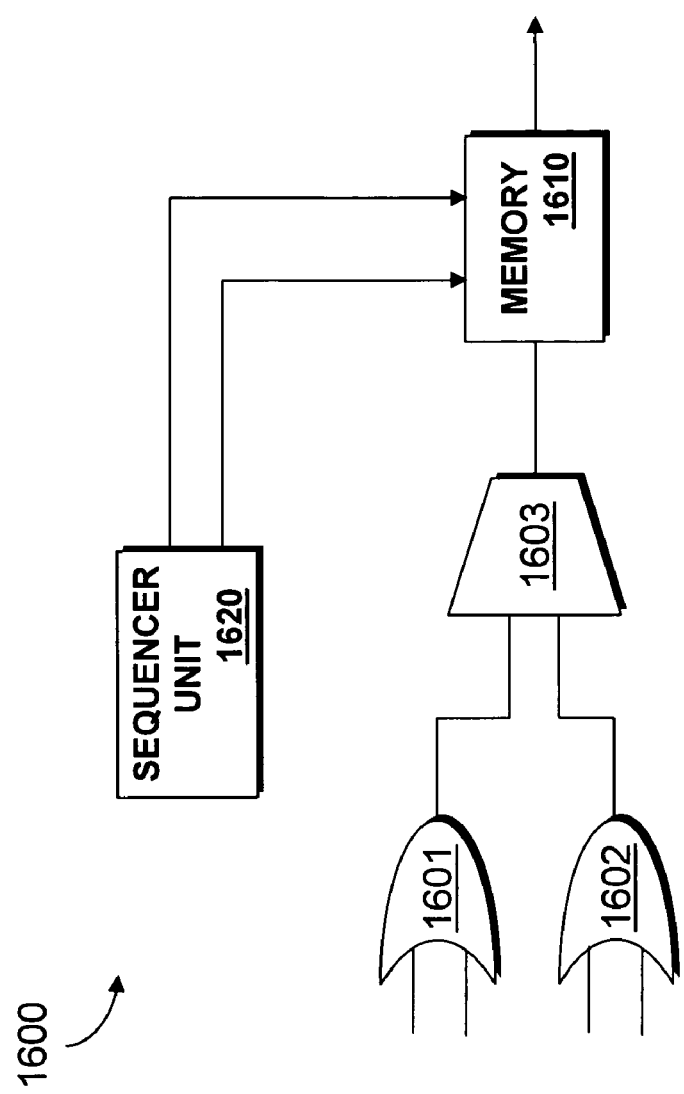
FIG. 16 illustrates a decoding bit selector and swapping unit according to an embodiment of the present invention.

FIG. 16 illustrates an exemplary decoding bit selector and swapping unit 1600 according to an embodiment of the present invention. The decoding bit selector and swapping unit 1600 may be implemented in the traceback processor 1300 shown in FIG. 13. The decoding bit selector and swapping unit 1600 includes a first and second component 1601 and 1602 that performs an OR operation. Each of the first and second components 1601 and 1602 decodes a bit by performing the OR operation on the top half of the bits in the traceback state from each of the two traceback engines 1310 and 1320 (shown in FIG. 13). The decoding bit selector and swapping unit 1600 includes a multiplexer 1603 that selects the output of the active traceback engine. The decoding bit selector and swapping unit 1600 includes a sequencer unit 1620. The sequencer unit 1620 addresses the memory 1610 that performs the swapping of the decoded bits. The memory 1610 outputs the final decoded bits.

Referring back to FIG. 13, the traceback engines 1310 and 1320, sequencer units 1330 and 1340, and decoding bit selector and swapping unit 1350 may be implemented using any known technique or circuitry. According to an embodiment of the present invention, the traceback engines 1310 and 1320, sequencer units 1330 and 1340, and decoding bit selector and swapping unit 1350 all reside on a single semiconductor substrate.

Figure 17:
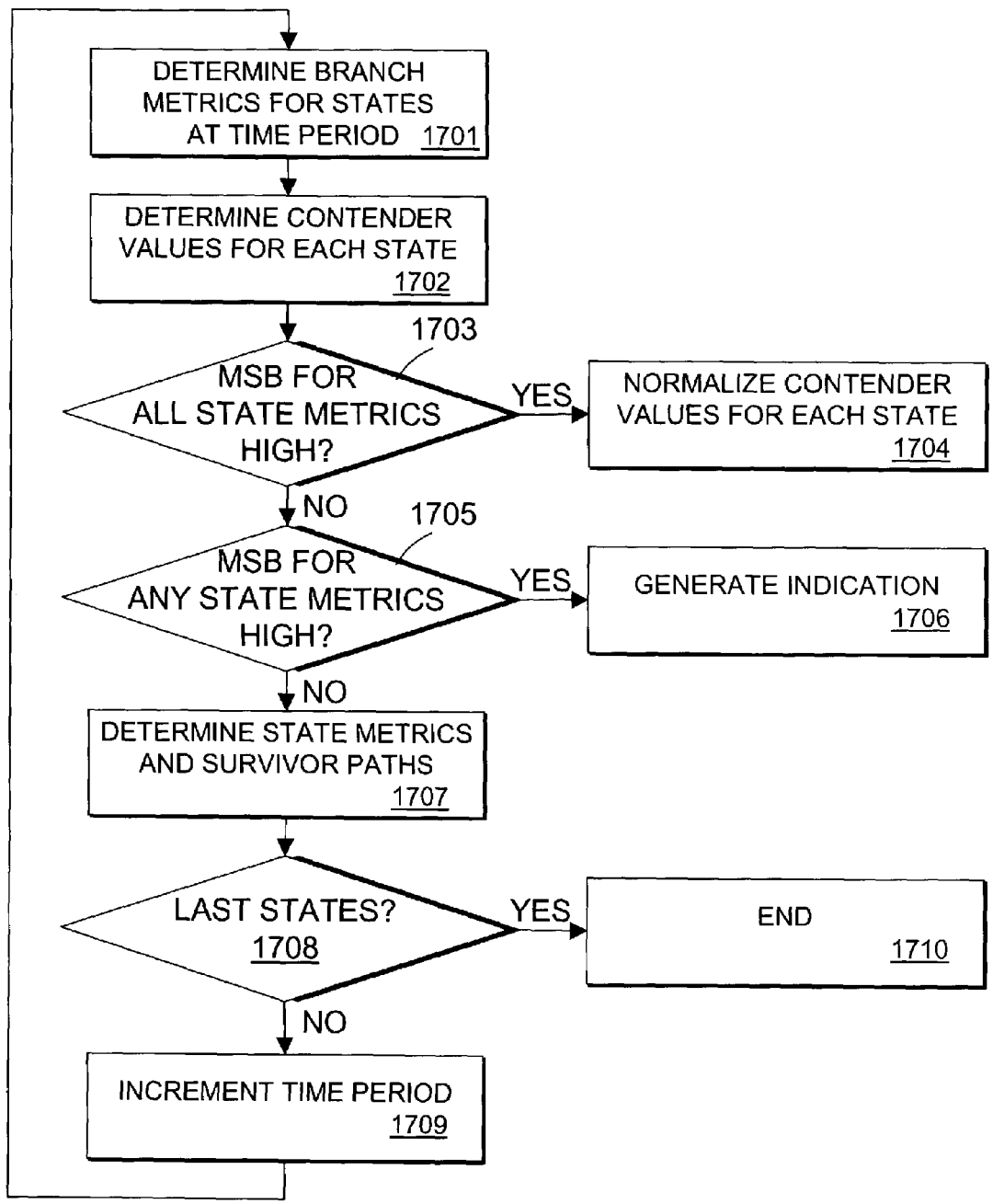
FIG. 17 is a flow chart illustrating a method for selecting survivor paths in a Viterbi decoder according to an embodiment of the present invention.

FIG. 17 is a flow chart illustrating a method for selecting survivor paths in a Viterbi decoding according to an embodiment of the present invention. At step 1701, branch metrics for states of an encoder during a time period are determined. According to an embodiment of the present invention, the branch metrics are Euclidean metrics that correspond to paths directed to the states of the encoder.

At step 1702, contender values are determined for states of an encoder during the time period. According to an embodiment of the present invention, a contender value for a state is determined by summing the branch metric for a path directed to the state with a state metric of a state from a previous time period that originates the path to the state.

At step 1703, it is determined whether the most significant bit of the state metric of all the states from the previous time period are high. If it is determined that the most significant bit of the state metric of all the states from the previous time period are high, control proceeds to step 1704. If it is determined that the most significant bit of the state metric of all the states from the previous time period are not all high, control proceeds to step 1705.

At step 1704, the contender values for the states of the encoder during the time period are normalized. According to an embodiment of the present invention, the contender values are normalized by zeroing their most significant bit.

At step 1705, it is determined whether the most significant bit of the state metric of any state from the previous time period is high. If it is determined that the most significant bit of the state metric of any state from the previous time period is high, control proceeds to step 1706. If it is determined that none of the most significant bit of the state metric of the states from the previous time period is high, control proceeds to step 1707.

At step 1706, an indication is generated that signals that a state of the encoder in a previous time period has reached a threshold value.

At step 1707, state metrics and survivor paths are determined. According to an embodiment of the present invention, a state metric for a state is determined from by selecting a contender value with the largest value. The path associated with the largest contender value is designated the survivor path to the state.

At step 1708, it is determined whether the states from the period processed are the last states to be processed. If the states are not the last to be processed, control proceeds to step 1709. If the states are the last to be processed, control proceeds to step 1710.

At step 1709, the time period is incremented and control proceeds to step 1701.

At step 1710, the process terminates.

Figure 18:
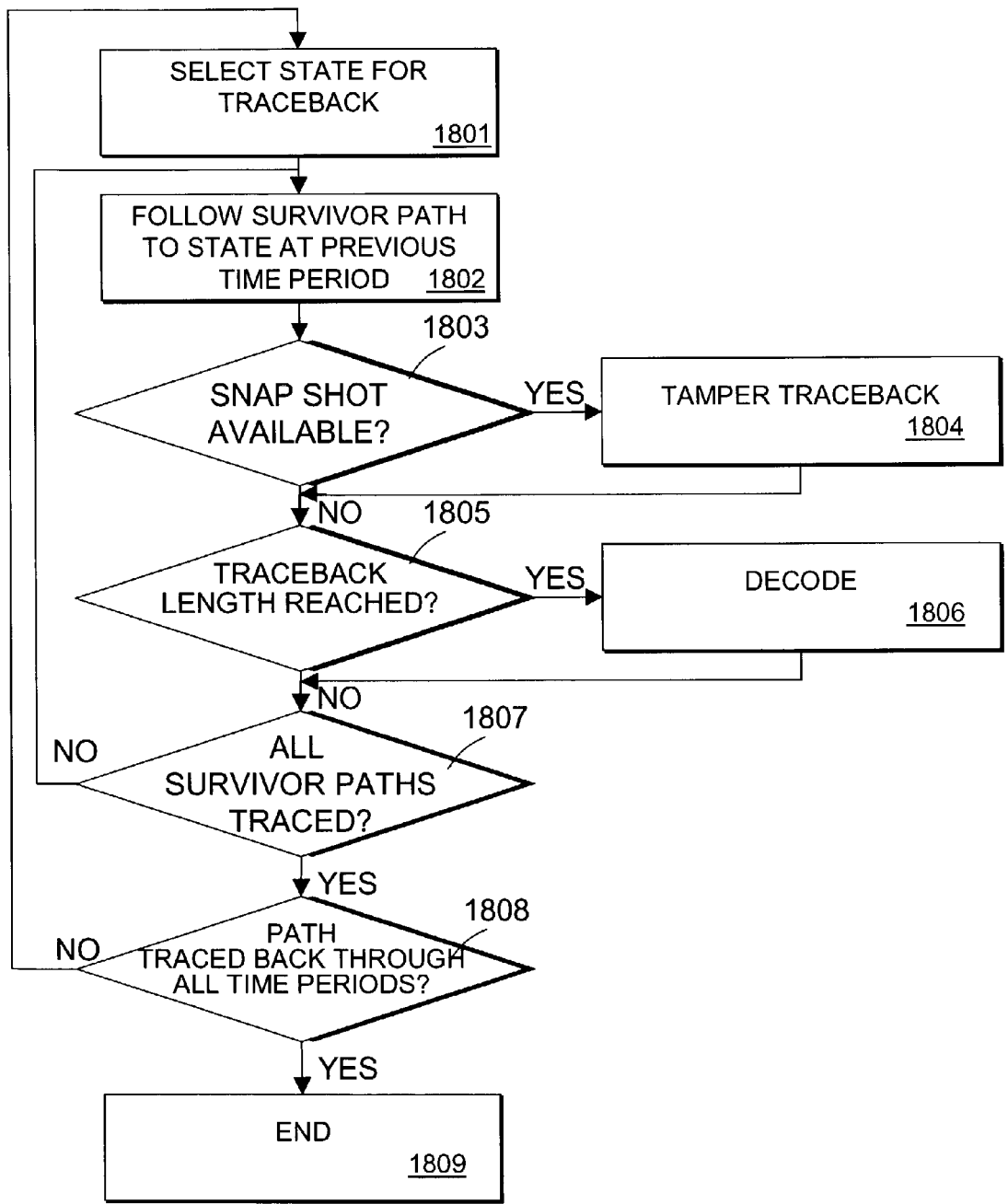
FIG. 18 is a flow chart illustrating a method for performing trackback in a Viterbi decoder according to an embodiment of the present invention.

FIG. 18 is a flow chart illustrating a method for performing traceback in a Viterbi decoder according to an embodiment of the present invention. At step 1801, a state is selected to begin a traceback segment. The state may be selected arbitrarily. According to an embodiment of the present invention, the state selected for traceback is in a time period at least twice the traceback length from the time period where states have state metrics and survivor paths determined.

At step 1802, a survivor path is followed to determine a next state at a previous time period.

At step 1803, it is determined whether a snap shot showing states having state metrics exceeding a threshold value is available. If it is determined that a snap shot is available, control proceeds to step 1804. If it is determined that a snap shot is not available, control proceeds to step 1805.

At step 1804, information from the snap shot is used to tamper the traceback. According to an embodiment of the present invention, traceback is re-initiated at the state(s) at the time period of the snap shot.

At step 1805, it is determined whether the traceback length is reached. If the traceback length is reached, control proceeds to step 1806. If the traceback length is not reached, control proceeds to step 1807.

At step 1806, the output bits received are decoded utilizing information from the traceback path derived.

At step 1807, it is determined whether all survivor paths are traced for the traceback segment. If not all the survivor paths are traced for the traceback segment, control proceeds to step 1802. If all the survivor paths are traced for the traceback segment, control proceeds to step 1808.

At step 1808, it is determined whether a path has been traced back through the states of all time periods receiving output bits. If it is determined that a path has not been traced back through the states of all time periods receiving output bits, control proceeds to step 1801. If it is determined that a path has been traced back through the states of all time periods receiving output bits, control proceeds to step 1809.

At step 1809, the process terminates.

FIGS. 17 and 18 illustrate flow charts describing a method for selecting survivor paths and performing traceback in a Viterbi decoder. Some of the steps illustrated in these figures may be performed sequentially, in parallel or in an order other than that which is described. It should be appreciated that not all of the steps described are required to be performed, that additional steps may be added, and that some of the illustrated steps may be substituted with other steps.

FIG. 19 illustrates when tampering is permitted during a traceback process. The unshaded regions represent when traceback and delivering of decbits may occur. The regions with vertical lines represent when traceback and tampering may occur, but not the delivering of decbits. The regions with diagonal cross hatching represent when traceback may occur, but not the delivering of decbits or tampering.

Figure 20:
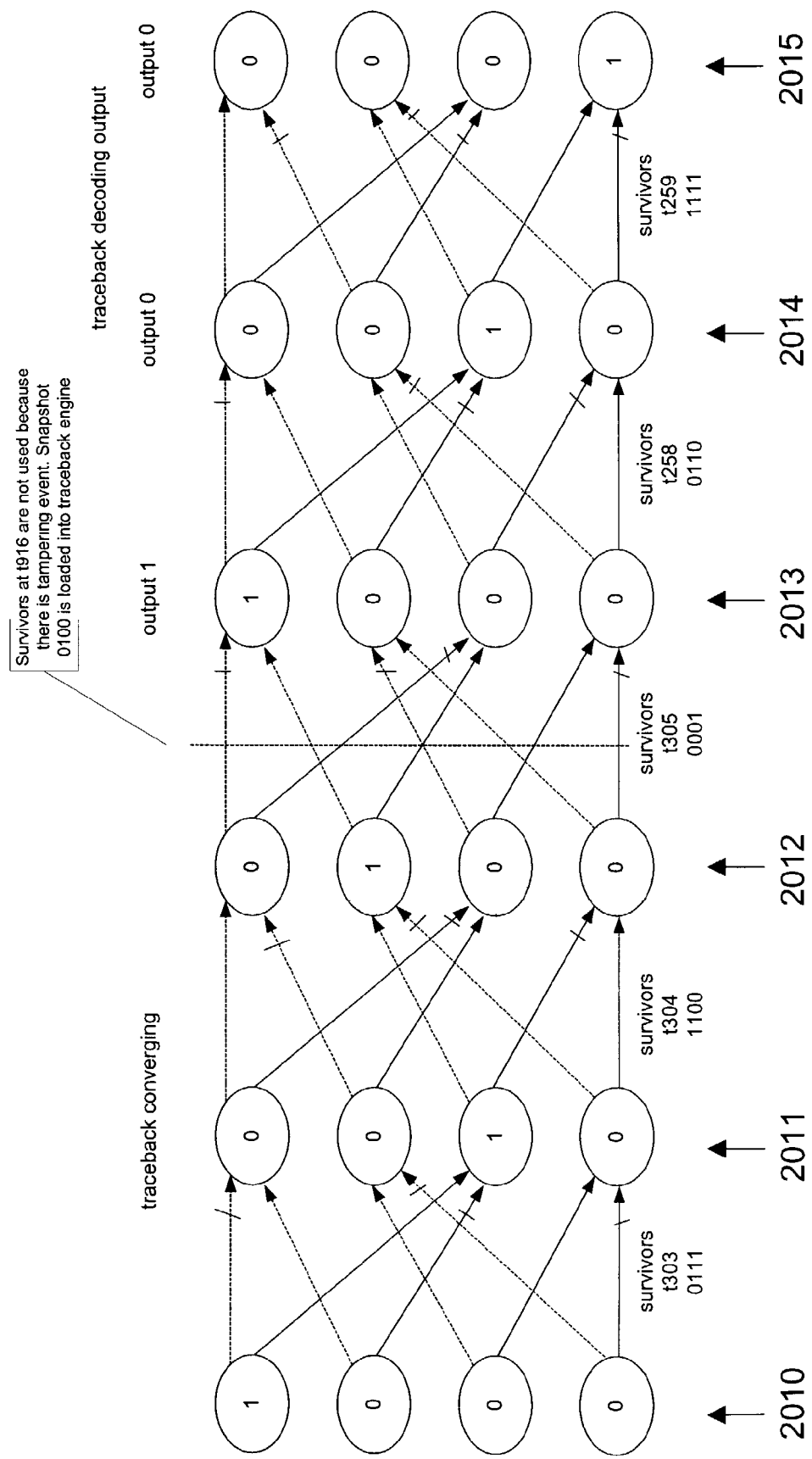
FIG. 20 illustrates an exemplary traceback and tampering operation.

FIG. 20 illustrates a snapshot of a traceback operation. Six state trellis columns are shown 2010–2015. The first three columns to the right 2010–2012 are in decoding mode. Bits are delivered at the output during the decoding mode. If the traceback engine has a path marked by a one in the top two spheres of a state trellis column, then the decoder outputs a logic 1. If the traceback engine has a path marked by a zero at the top two spheres, then a logic 0 is delivered. After employing survivors generated at time t258, the traceback finishes to deliver a block of v=12 bits. For this example, the traceback length is chosen to be 12. The traceback engine has traced survivors t281 back to t258, 24 in total. The first 12 sought convergence and the following 12 delivered 12 decoded bits. The traceback engine may start with survivors t305 to t282. As shown in FIG. 20, the traceback status between survivors t305 and t304 has been tampered. The spheres in column 2012 indicate that the traceback engine has been loaded with the snapshot of the most significant bits of the state metrics when a half range crossing occurred at that time.

Figure 21:
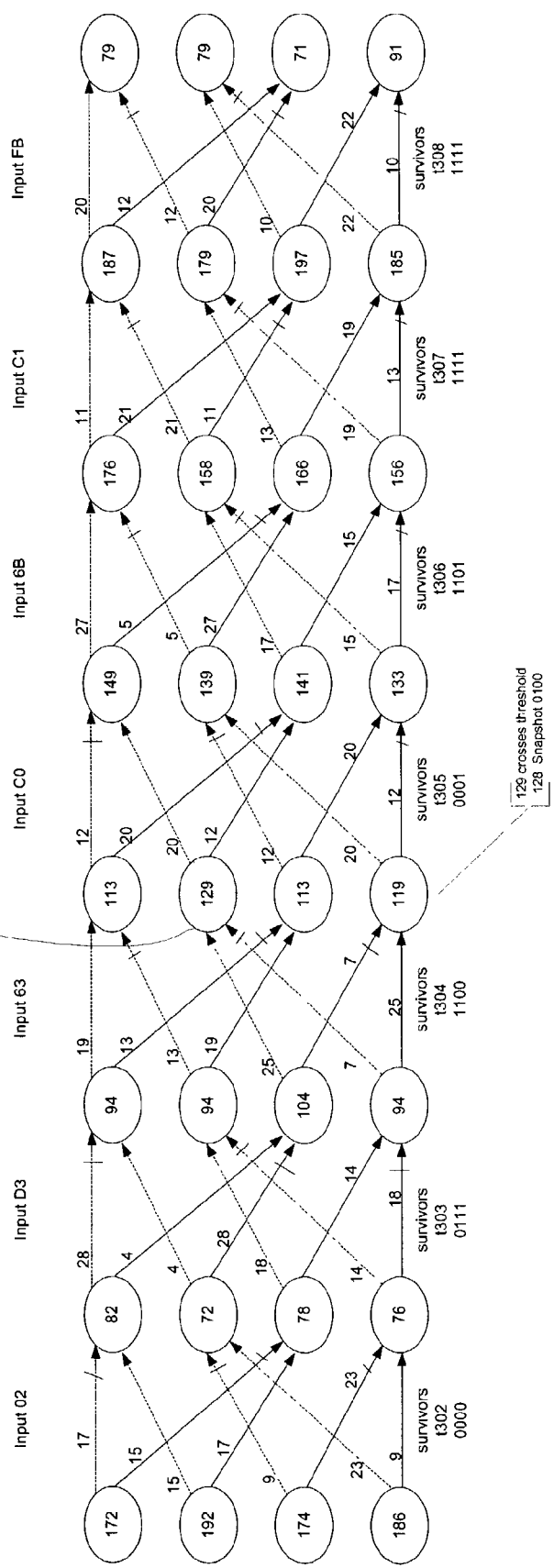
FIG. 21 illustrates an exemplary trellis forward operation with threshold crossing.

FIG. 21 shows the trellis with the state metrics and input data and survivors t302 to t308. As shown in FIG. 21, the state represented by sphere 2101 has crossed the half range 128. In this example, the half range where the state metrics is 8 bits, is 128. Crossing the half range produces the snapshot 0100. The survivors at the snapshot are stored in memory and are processed at a later time by the traceback engine. The snapshot 0100 is stored as a value in a "time" counter. This value is compared against the address that retrieves the survivors from memory. When the survivor t305 is retrieved, the snapshot 0100 is loaded into the traceback engine. This is referred to as "tampering the traceback". This allows the traceback to be brought to start from the state that contains the highest state metrics value at that point of time.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A viterbi decoder, comprising:
    a branch metric processor to determines branch metrics for states of an encoder in a time period;
    a survivor processor to select survivor paths between states of the encoder in consecutive time periods;
    a normalization unit to normalize state metrics of the states of the encoder in the time period by subtracting a constant; and
    a state metrics monitor to generate a normalization signal in response to determining that a most significant bit of the state metrics of all the states of the encoder in the time period is one, wherein the state metrics monitor comprises a circuit that performs an all-wide-AND function that processes the most significant bits of the state metrics of the states of the encoder in the time period.

2. The apparatus of claim 1, wherein the normalization unit operates to subtract the constant by zeroing the most significant bit of the state metrics of the states of the encoder in the time period in response to the normalization signal.

3. A The apparatus of claim 1, wherein the normalization unit includes a normalization circuit that comprises:
    a first circuit to perform an inversion function; and
    a second circuit to perform an ANDing function.

4. The apparatus of claim 1, wherein the branch metric processor includes a branch metric calculation unit comprising:
- logic to branch metric units to retrieve branch metric information for given hypotheses; and
- adders to sum the branch metric information to determine the branch metrics.

5. The apparatus of claim 1, wherein the survivor processor includes an add, compare, select (ACS) unit that comprises:
- adder circuits to determine a first contender value associated with a first path to a state in the time period and a second contender value associated with a second path to the state in the time period from branch metrics and state metrics associated with the first and second paths; and
- a comparator to select the survivor branches in response to comparing the first and second contender values.

6. A viterbi decoder, comprising:
- a branch metric processor to determines branch metrics for states of an encoder in a time period;
- a survivor processor to select survivor paths between states of the encoder in consecutive time periods; and
- a state monitor that includes a circuit to perform an all-wide-OR function to generate an indication that signals that a state metric of a state of the encoder in a previous time period has reached a threshold value.

7. The apparatus of claim 6, herein the state monitor comprises a finite state machine to prevent consecutive indications to be generated before normalization of the state metrics.

8. The apparatus of claim 6, further comprising a normalization unit to normalize state metrics of the states of the encoder in the time period by subtracting a constant in response to a normalization signal.

9. The apparatus of claim 8, wherein the state monitoring unit outputs a normalization signal in response to determining that the most significant bit of the state metrics of all the states of the encoder in the time period is one.

10. The apparatus of claim 8, wherein the state monitoring unit comprises a circuit to perform an all-wide-AND function that processes the most significant bits of the state metrics of the states of the encoder in the time interval.

11. The apparatus of claim 8, wherein the normalization unit subtracts the constant by zeroing the most significant bit of the state metrics of the states of the encoder in the time period.

12. The apparatus of claim 8, wherein the normalization unit includes a normalization circuit that comprises:
- a first circuit to perform an inversion function; and
- a second circuit to perform an ANDing function.

13. A method for managing state metrics of states in a Viterbi decoder, comprising:
- determining whether state metrics of states at a time period have reached a threshold by determining whether most significant bits of the state metrics are high;
- normalizing the state metrics of the states at the time period by subtracting a constant;
- determining whether any state metric of the states at the time period has reached a second threshold; and
- generating an indication in response to determining that the second threshold has been reached.

14. The method of claim 13, wherein normalizing the state metrics comprises zeroing most significant bits of the state metrics.

15. The method of claim 13, wherein determining whether any state metric of the state at the time period has reached a second threshold comprises determining whether a most significant bit of any of the state metric is high.

16. The method of claim 13, further comprising tampering traceback in response to the indication.

17. A method for managing state metrics of states in a Viterbi decoder, comprising:
- determining whether state metrics of states at a time period have reached a threshold;
- normalizing the state metrics of the states at the time period by subtracting a constant;
- determining whether any state metric of the states at the time period has reached a second threshold; and
- generating an indication in response to determining that the second threshold has been reached.

18. The method of claim 17, Wherein determining whether any state metric of the state at the time period has reached a second threshold comprises determining whether a most significant bit of any of the state metric is high.

19. The method of claim 17, further comprising tampering traceback in response to the indication.

* * * * *